(12) United States Patent
Lee et al.

(10) Patent No.: US 7,576,484 B2
(45) Date of Patent: Aug. 18, 2009

(54) ORGANIC ELECTROLUMINESCENCE DEVICE

(75) Inventors: Kyung Hoon Lee, Seoul (KR); Jeong Dae Seo, Gwacheon-si (KR); Hyun Cheol Jeong, Jinju-si (KR); Chun Gun Park, Seoul (KR); Jung Keun Kim, Seoul (KR); Sung Kab Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 245 days.

(21) Appl. No.: 11/084,021

(22) Filed: Mar. 21, 2005

(65) Prior Publication Data

US 2005/0208334 A1    Sep. 22, 2005

(30) Foreign Application Priority Data

Mar. 22, 2004   (KR) .................. 10-2004-0019356

(51) Int. Cl.
 *H01L 51/54* (2006.01)
 *H05B 33/14* (2006.01)
 *C09K 11/06* (2006.01)
(52) U.S. Cl. ................. 313/504; 257/40; 257/E51.051; 313/506; 428/690; 428/917
(58) Field of Classification Search ................ None
 See application file for complete search history.

(56) References Cited

U.S. PATENT DOCUMENTS 5,858,562 A       1/1999   Utsugi et al. ................ 428/690
2004/0262574 A1*  12/2004  Suzuki et al. .......... 252/301.16

FOREIGN PATENT DOCUMENTS

| EP | 1 394 188 A1 | 3/2004 |
| JP | 09-151371    | * 6/1997 |
| JP | 10-308280 A  | 11/1998 |
| JP | 11-251068 A  | 9/1999 |
| WO | WO 2004/014985 A1 | 2/2004 |

OTHER PUBLICATIONS

Machine Translation, JP 09-151271, Ito et al.*
Chinese Office Action dated Dec. 7, 2007.

* cited by examiner

*Primary Examiner*—D. Lawrence Tarazano
*Assistant Examiner*—Brett A Crouse
(74) *Attorney, Agent, or Firm*—Holland & Knight LLP

(57) ABSTRACT

An organic electroluminescence device is disclosed, to realize improvement of luminance and decrease on driving voltage, which includes an anode, a hole injecting layer, a hole transport layer, an emitting layer, and a cathode, wherein, the hole injecting layer and the hole transport layer are formed of the material expressed by the following chemical formula 1:

1 Claim, No Drawings

ORGANIC ELECTROLUMINESCENCE DEVICE

CROSS-REFERENCE TO RELATED APPLICATIONS

This application claims the benefit of Korean Application No. 10-2004-0019356, filed Mar. 22, 2004, which is hereby incorporated by reference as if fully set forth herein.

BACKGROUND OF THE INVENTION

1. Field of the Invention

The present invention relates to an organic electroluminescence device.

2. Discussion of the Related Art

Generally, an organic electroluminescence device includes an organic layer formed between an electron injecting electrode (cathode) and a hole injecting electrode (anode). In this state, according as an electric charge is injected to the organic layer, an electron and a hole make one pair, and then are extinct, thereby generating light.

The organic electroluminescence device may be formed on a flexible substrate of a transparent material, such as plastic. In addition, the organic electroluminescence device can be operated at a lower voltage below 10V, as compared with a plasma display panel or an inorganic electroluminescence EL display. Also, the organic electroluminescence device realizes low power consumption and great color quality. Furthermore, the organic electroluminescence device can display three colors of red, green and blue, so that the organic electroluminescence divice has attracted great attentions as a next generation display device.

A method for manufacturing the organic electroluminescence device will be description as follows.

(1) First, an anode material is coated on a transparent substrate. For example, the anode material such as ITO (Indium Tin Oxide) is used generally.

(2) Then, a hole injecting layer HIL is formed on the anode material. At this time, the hole injecting layer HIL is generally formed in a method of coating Copper phthalocyanine (CUPC) at a thickness of 10 nm to 30 nm.

(3) After that, a hole transport layer HTL is coated on the hole injecting layer HIL. At this time, the hole transport layer HTL is formed in a method of depositing 4,4'-bis[N-(1-naphthyl)-N-phentylamino]-biphenyl(NPB) at a thickness of 30 nm to 60 nm.

(4) An organic emitting layer is formed on the hole transport layer. In this case, a dopant may be added to the organic emitting layer as needed. In case of the green luminescesnce, tris(8-hydroxy-quinolate)aluminum(Alq3) is deposited at a thickness of 30 nm to 60 nm as the organic emitting layer, and MQD(N-methylquinacridone) is commonly used as the dopant.

(5) Then, an electron injecting/transport layer EITL may be formed on the organic emitting layer, or an electron transport layer ETL and an electron injecting layer EIL may be sequentially formed on the organic emitting layer. In case of the green luminescence, Alq3 has a great electron transport capability, so that there is no requirement for forming the electron injecting/transport layer.

(6) Next, a cathode is formed on the electron transport layer (or electron injecting/transport layer), and then a protecting layer is coated as needed, thereby completing the organic electroluminescence device.

In the aforementioned structure of the organic electroluminescence device, the hole injecting and transport layer has an effect on luminance and driving voltage of the device. That is, the hole injecting and transport layer plays an important part in the life span of the device. Accordingly, it is necessary to research and develop a material for the hole injecting and transport layer, to realize improvement of luminance and decrease on driving voltage.

SUMMARY OF THE INVENTION

Accordingly, the present invention is directed to an organic electroluminescence device that substantially obviates one or more problems due to limitations and disadvantages of the related art.

An object of the present invention is to provide an organic electroluminescence device to realize improvement of luminance and decrease on driving voltage.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescence device includes an anode, a hole injecting layer, a hole transport layer, an emitting layer, and a cathode, wherein, the hole injecting layer and the hole transport layer are formed of the material expressed by the following chemical formula 1:

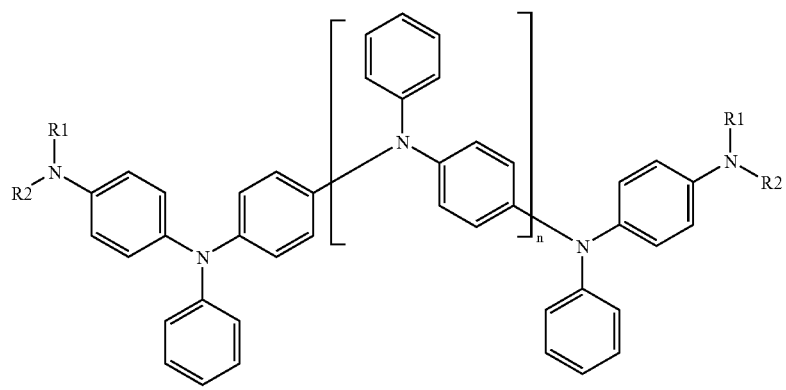

It is to be understood that both the foregoing general description and the following detailed description of the present invention are exemplary and explanatory and are intended to provide further explanation of the invention as claimed.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an organic electroluminescence device according to the preferred embodiment of the present invention will be described as follows.

The organic electroluminescence device according to the preferred embodiment of the present invention is formed of an anode, a hole injecting layer, a hole transport layer, an emitting layer, and a cathode. Herein, the hole injecting layer and/or the hole transport layer are formed of the material having the following chemical formula 1:

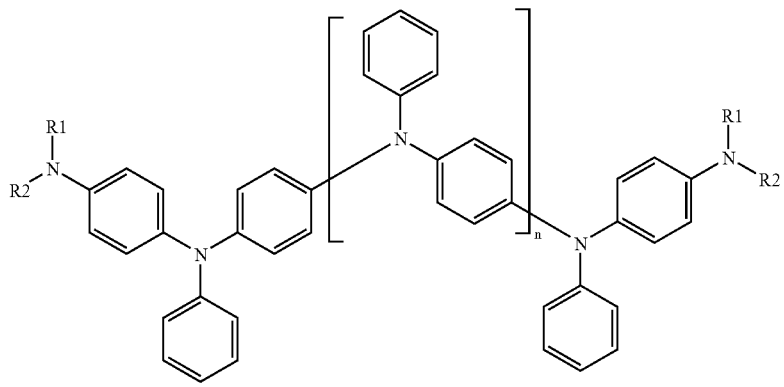

wherein 'n' is a positive number between 1 and 4, and 'R1' or 'R2' is selected from the group consisting of a substituted or non-substituted aromatic group, a hetero ring group, an aliphatic group, or hydrogen.

Also, at least any one of 'R1' and 'R2' may be selected from substituted or non-substituted phenyl, biphenyl, pyridyl, naphthyl, quinolyl, isoquinolyl, fluorenyl, terphenyl, anthryl, phenanthryl, methyl, ethyl, propyl, isopropyl and the like.

The substituent on each of the substituted 'R1' and 'R2' may be selected from the group consisting of alkyl, aryl, alkoxyl, halogen, cyano, alkylaryl, vinylaryl and the like.

Also, the substituent may be selected from the group consisting of methyl, ethyl, propyl, isopropyl, t-butyl, cyclohexyl, methoxy, ethoxy, propoxy, butoxy, fluoro, chloro, phenoxy, tolyloxy and the like.

Accordingly, the material for the hole injecting layer and the hole transport layer may be selected from any one of the following chemical formula 2, to which 'R1' and 'R2' are applied:

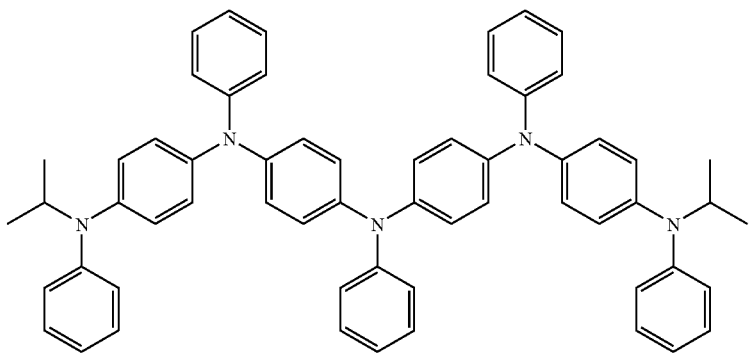

HM-01

-continued
HM-02
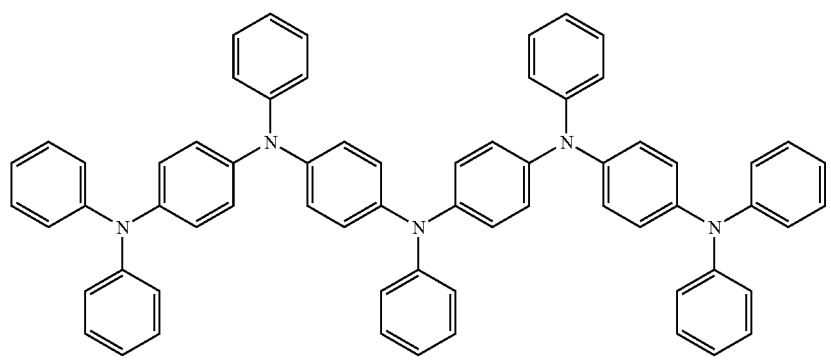
HM-03
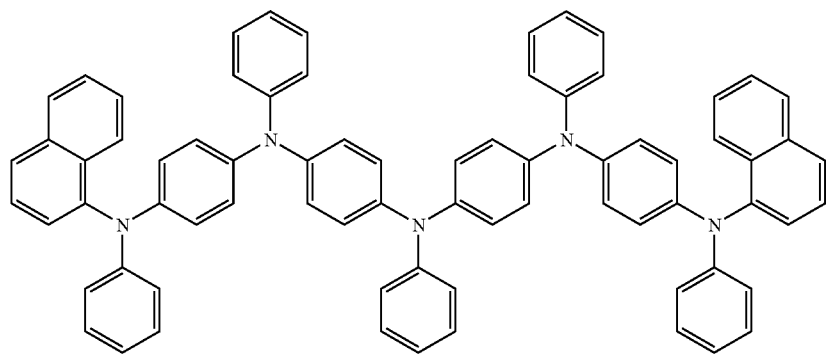
HM-04
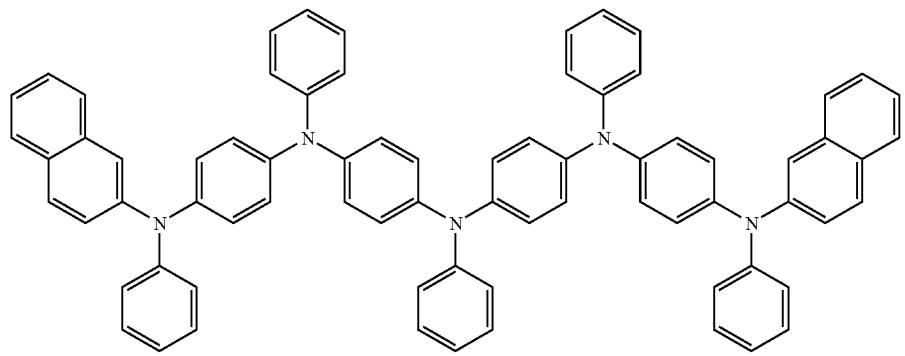
HM-05
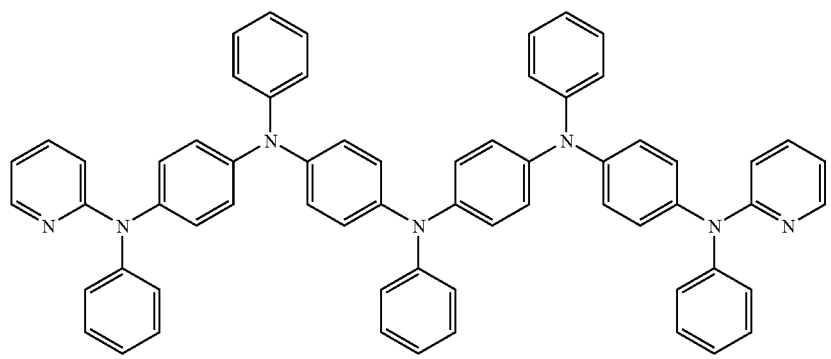

-continued
HM-06
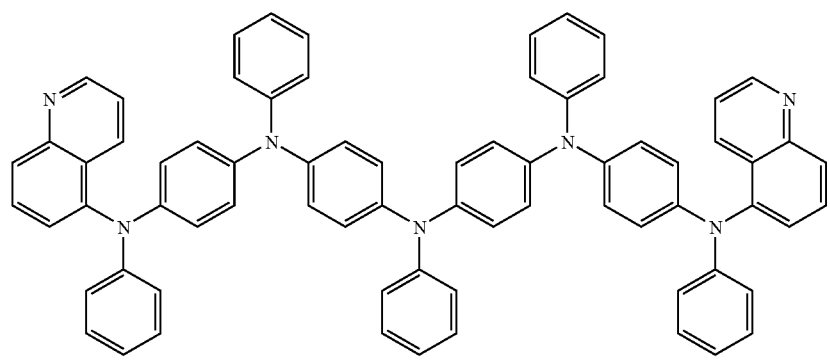
HM-07
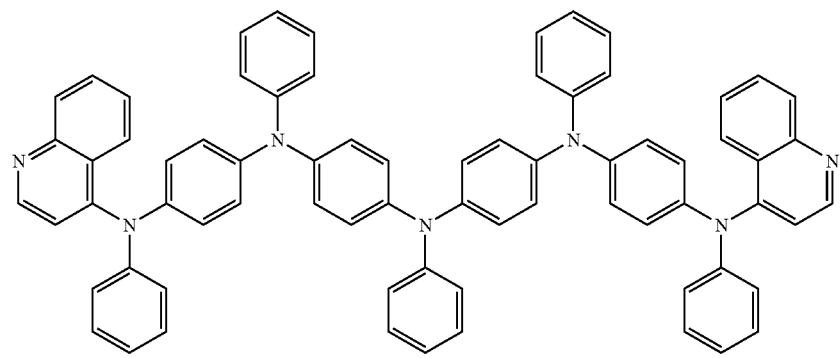
HM-08
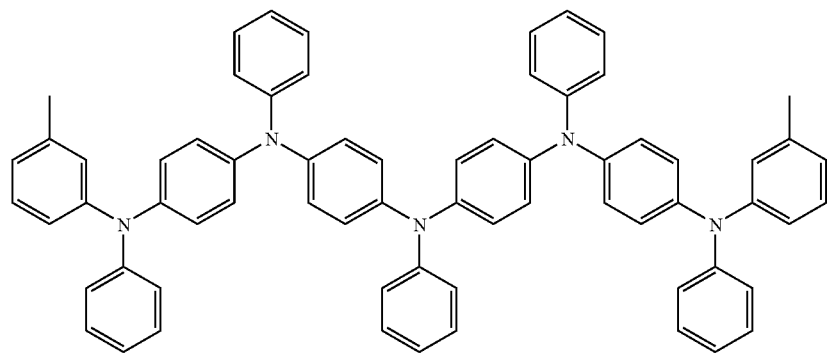
HM-09
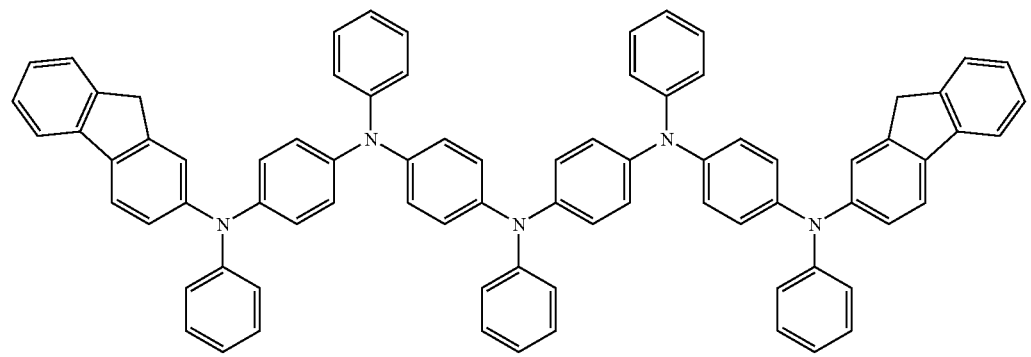

-continued
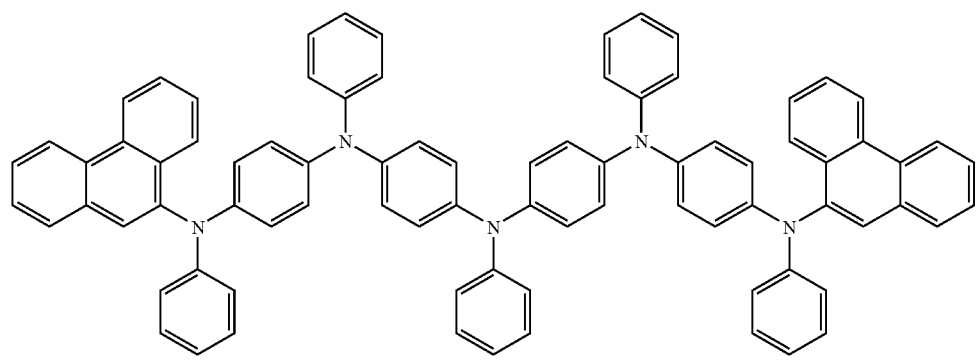
HM-10
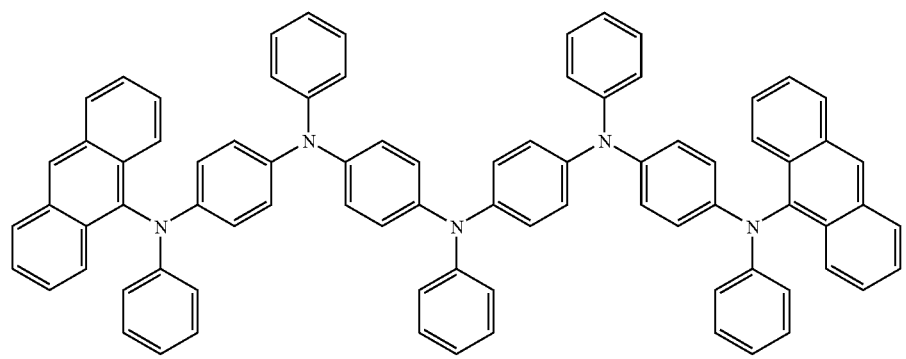
HM-11
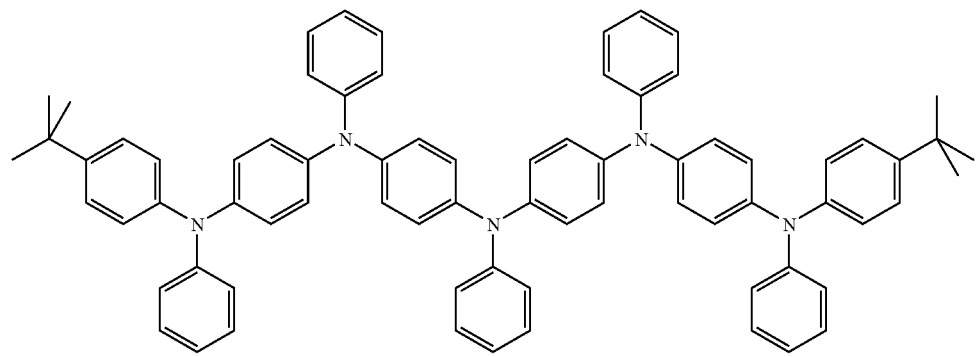
HM-12
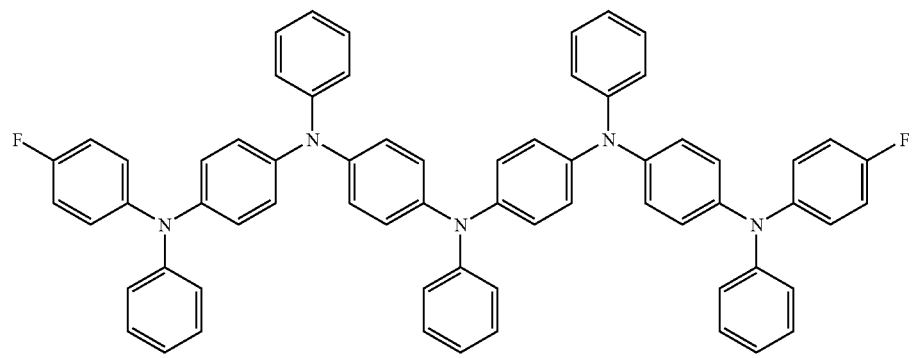
HM-13

-continued
HM-14
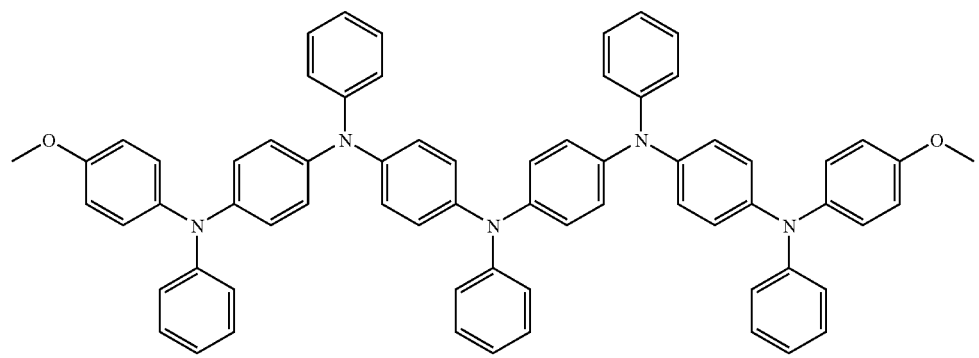
HM-15
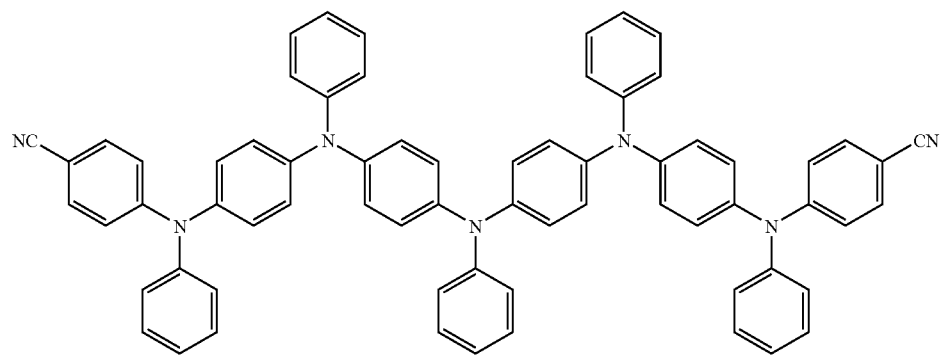
HM-16
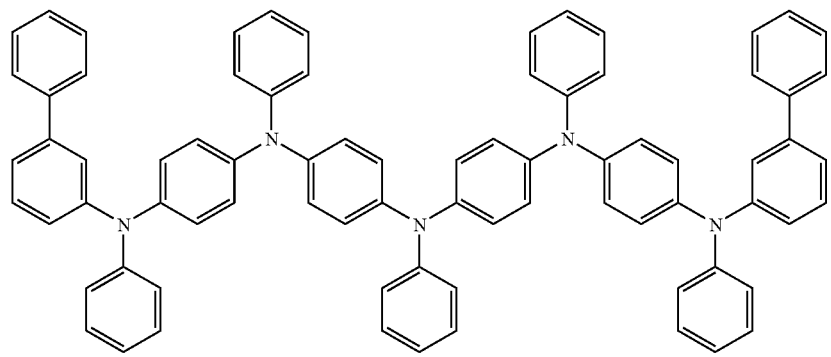
HM-17
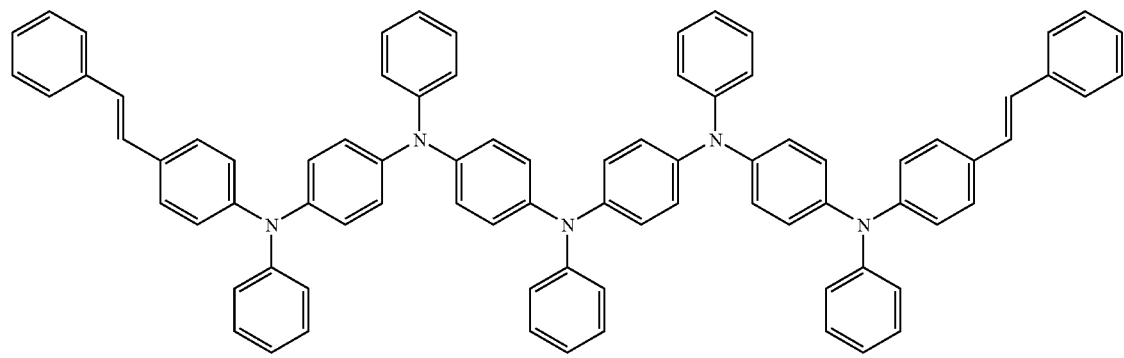

-continued
HM-18
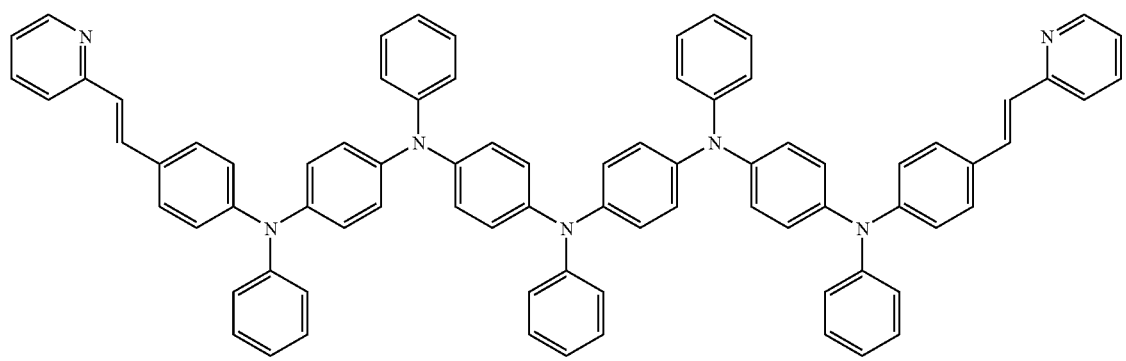
HM-19
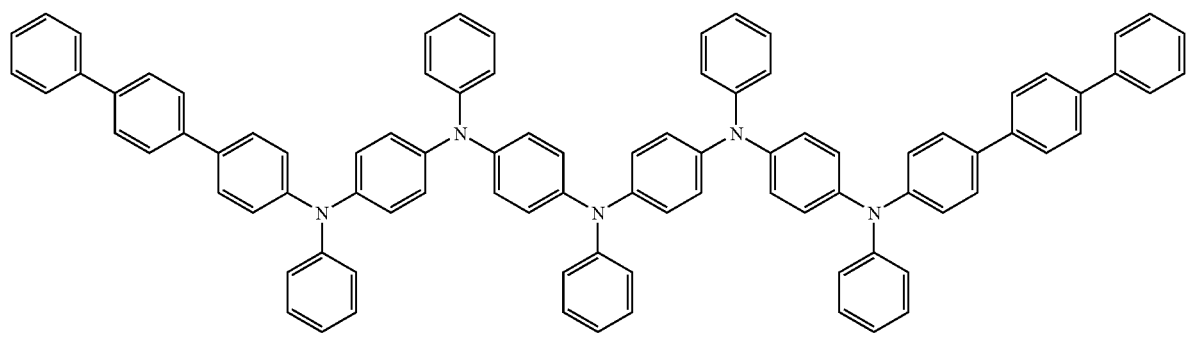
HM-20
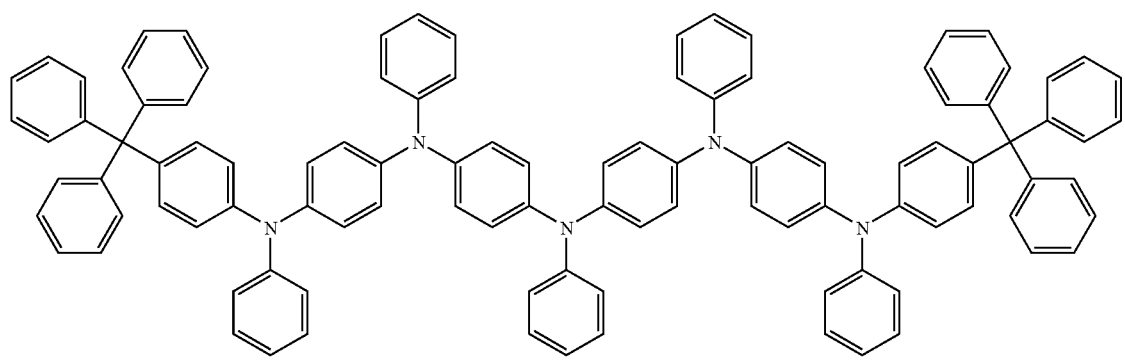
HM-21
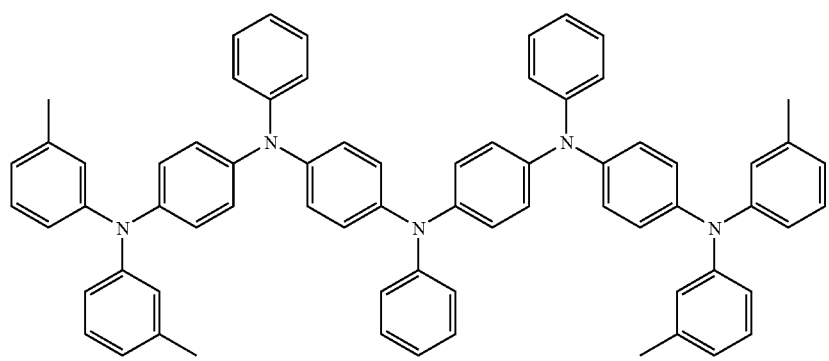

-continued
HM-22
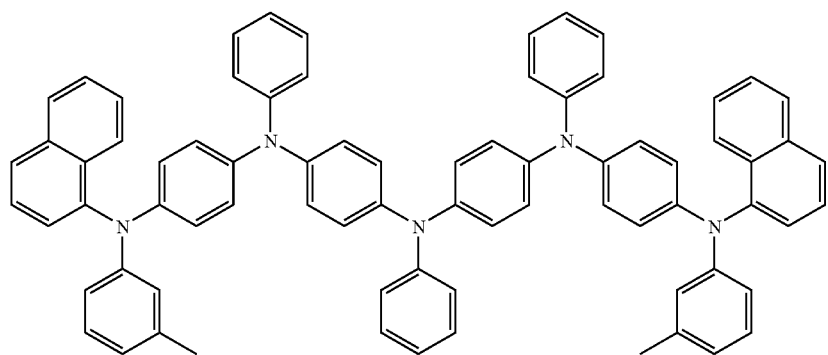
HM-23
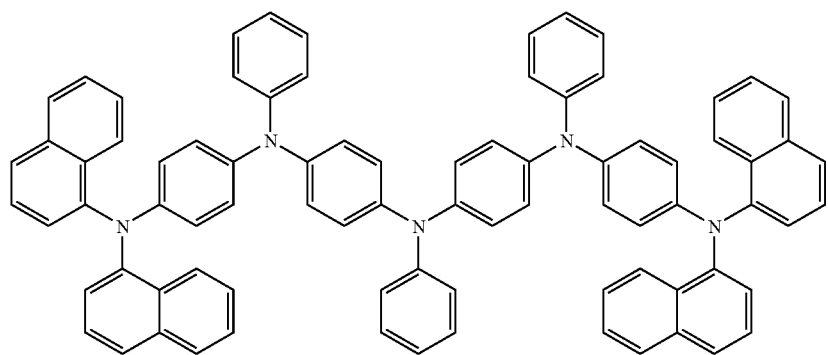
HM-24
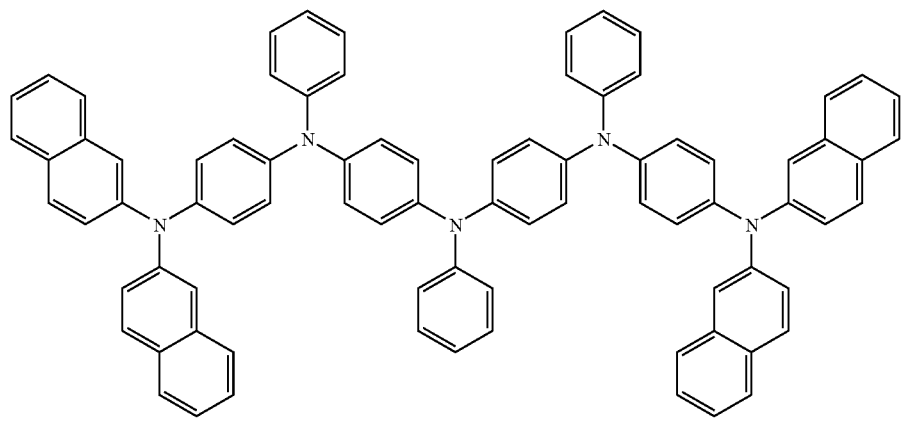
HM-25
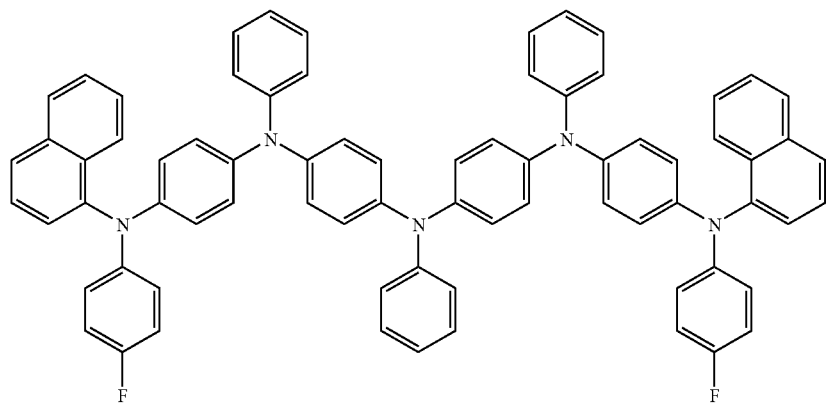

HM-26
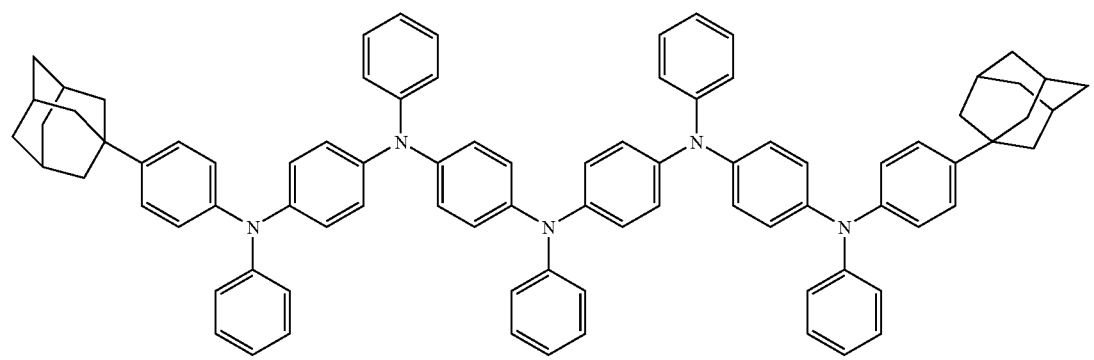
HM-27
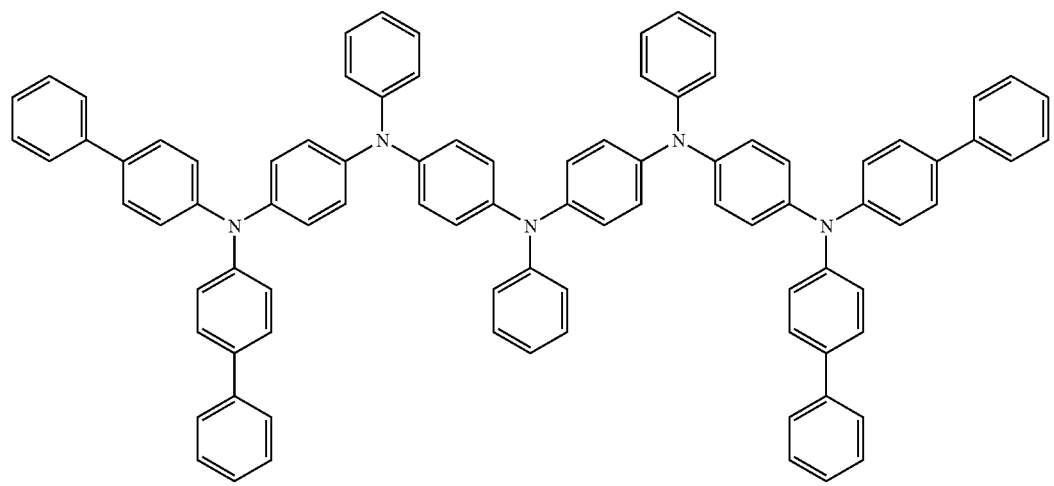
HM-28
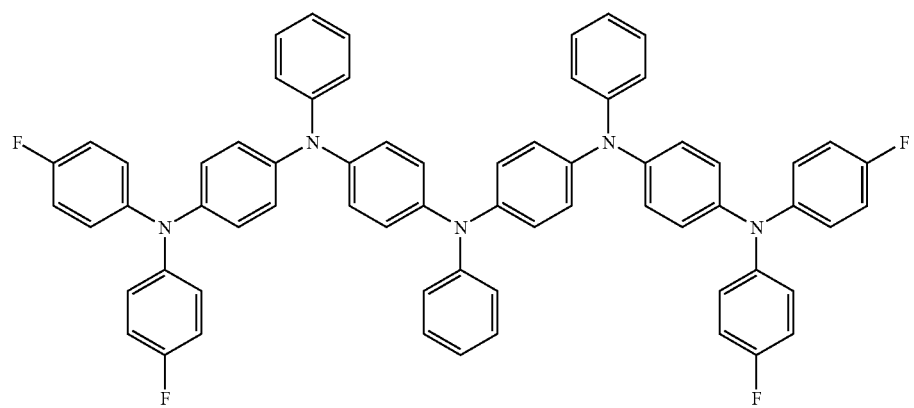

-continued
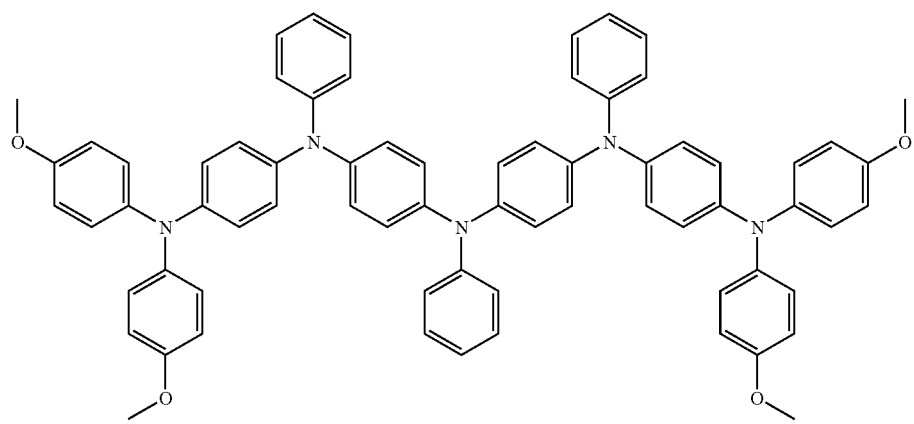
HM-29
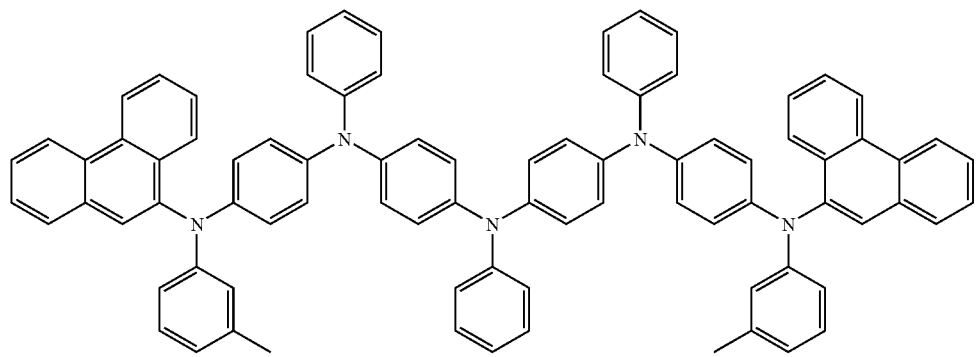
HM-30
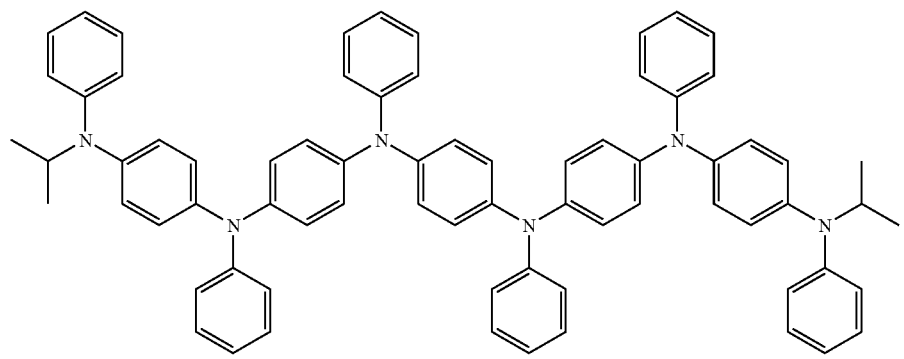
HM-31
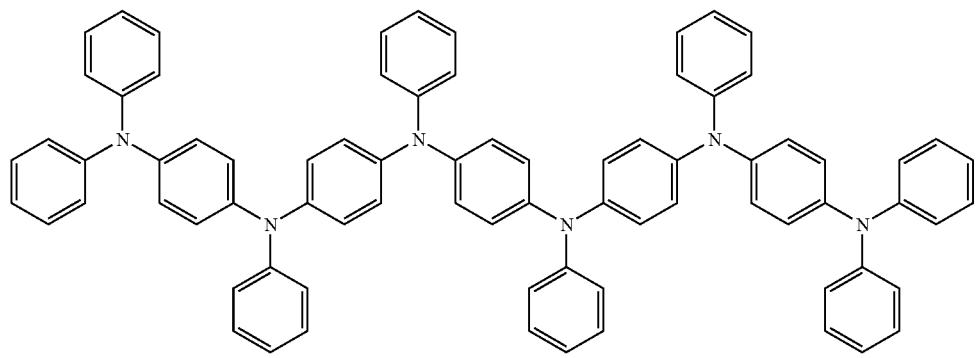
HM-32

-continued
HM-33
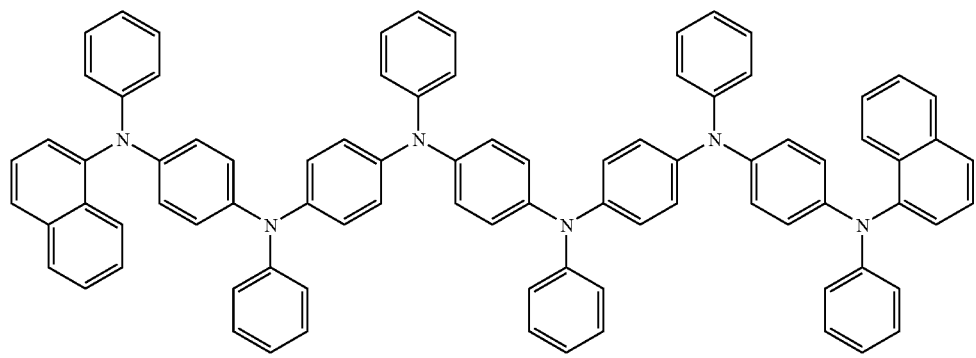
HM-34
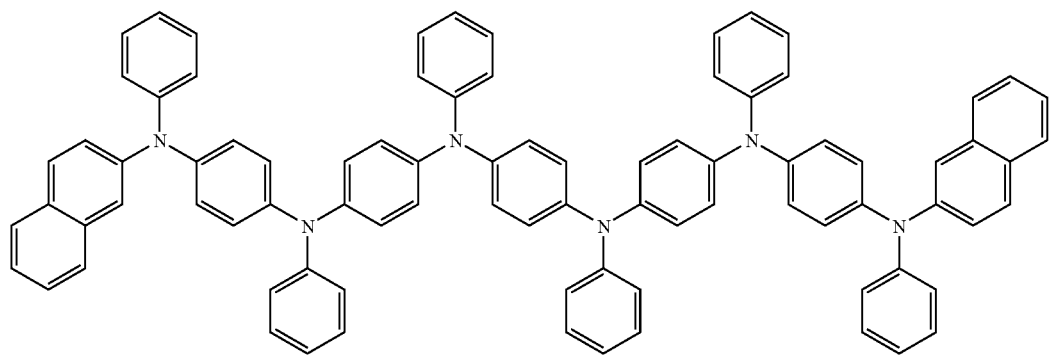
HM-35
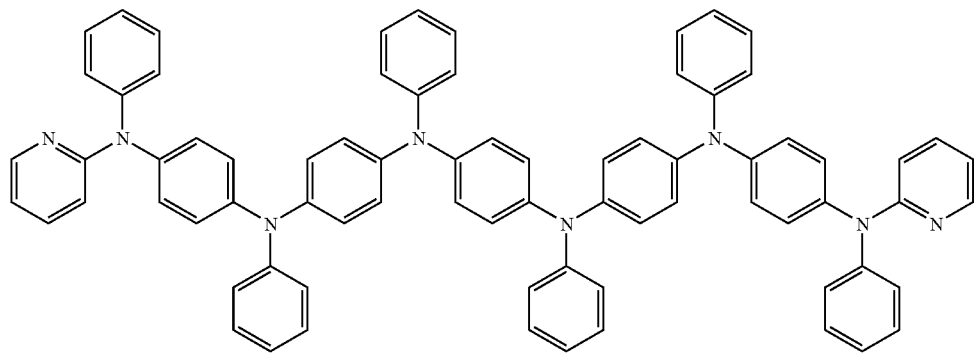
HM-36
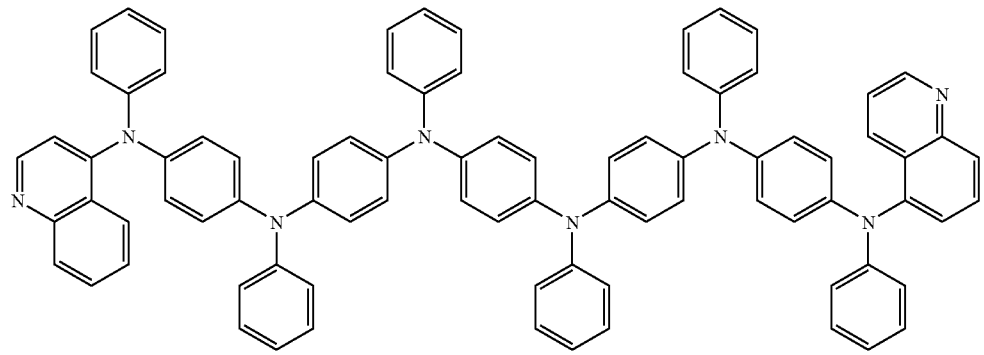

-continued
HM-37
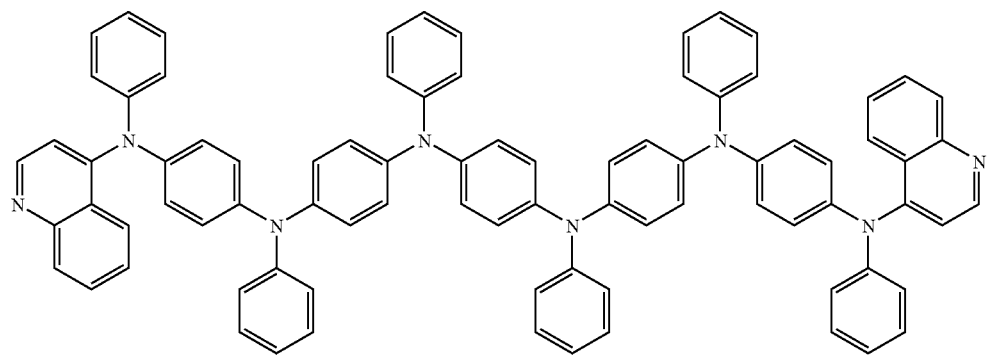
HM-38
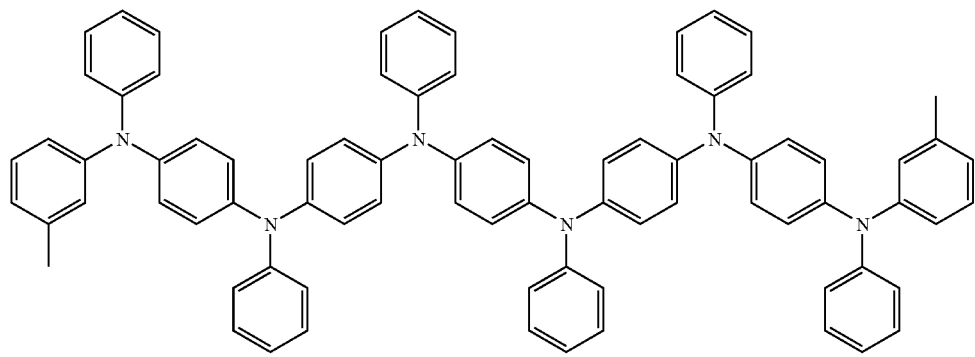
HM-39
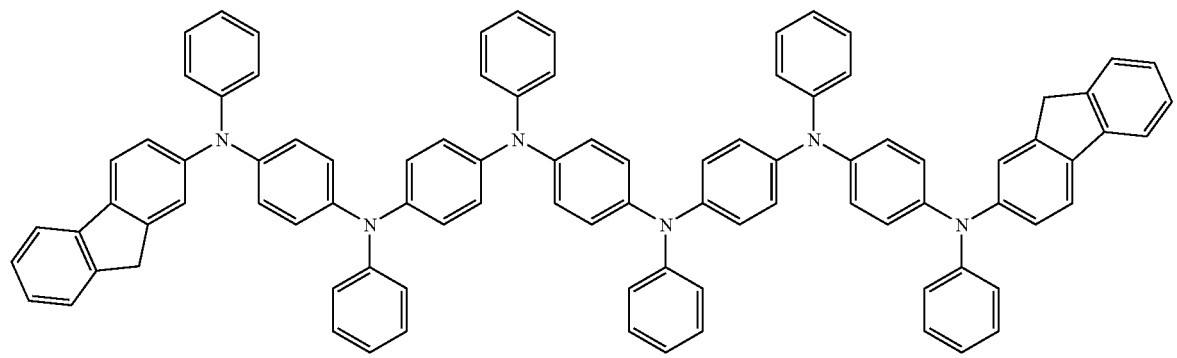
HM-40
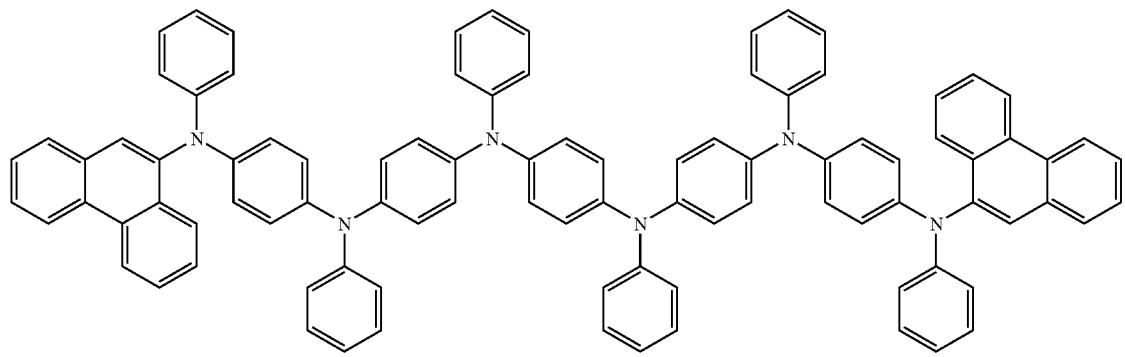

-continued
HM-41
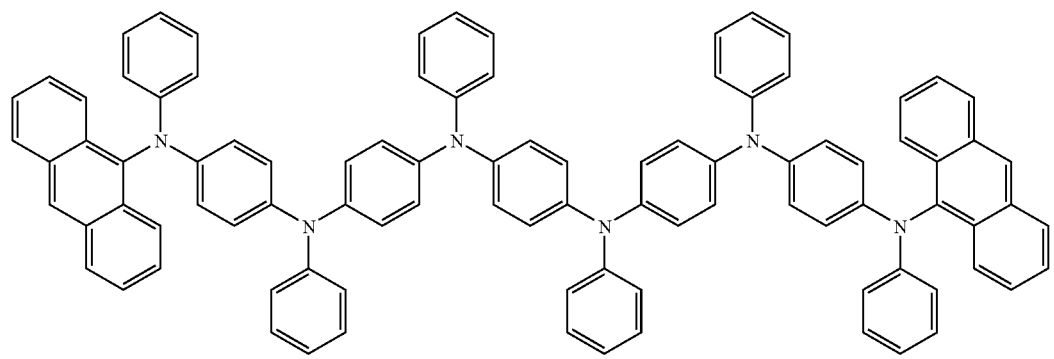
HM-42
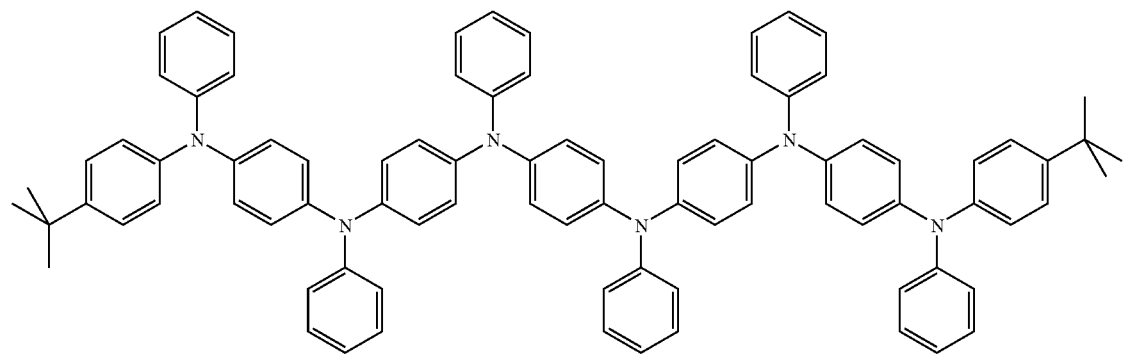
HM-43
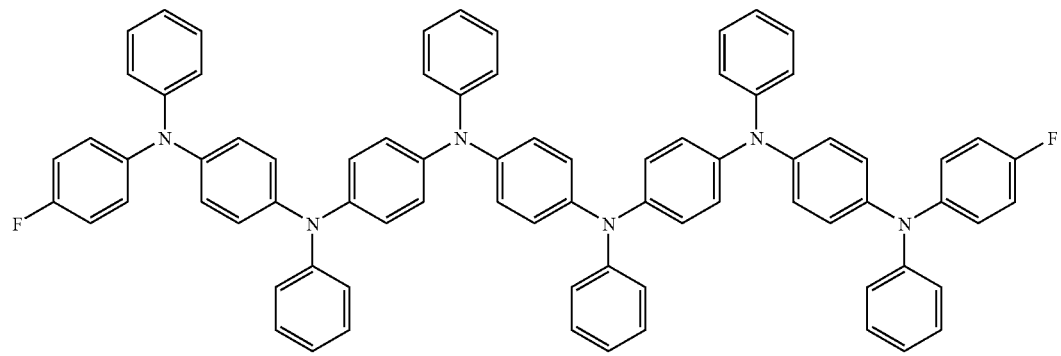
HM-44
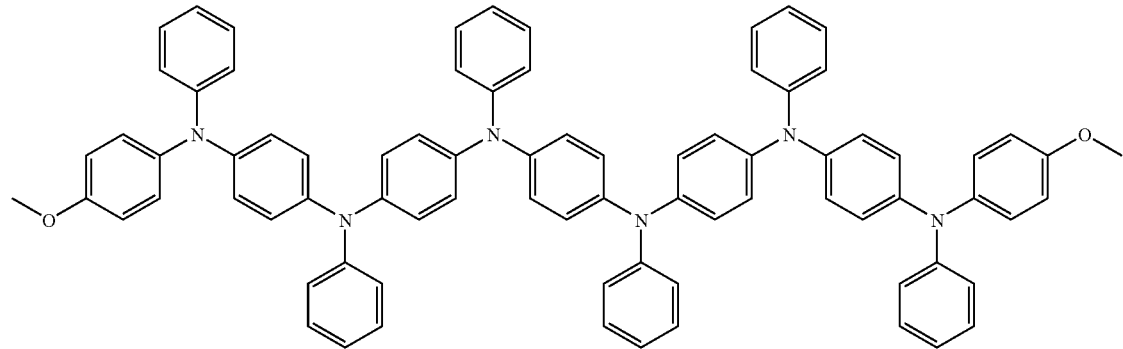

-continued
HM-45
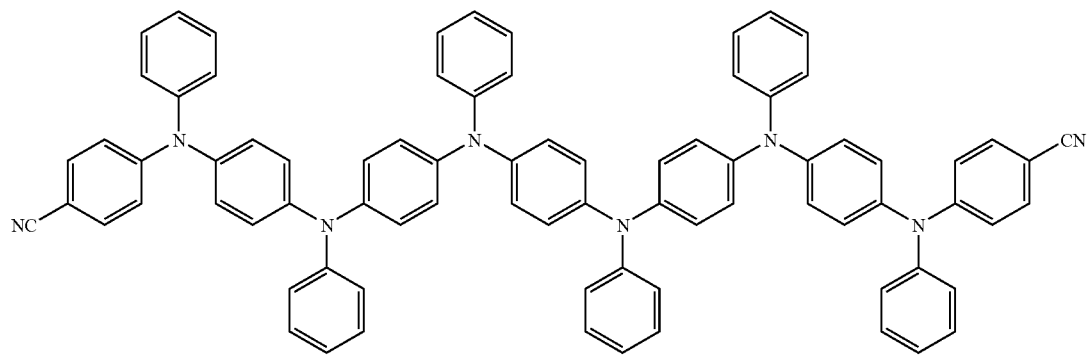
HM-46
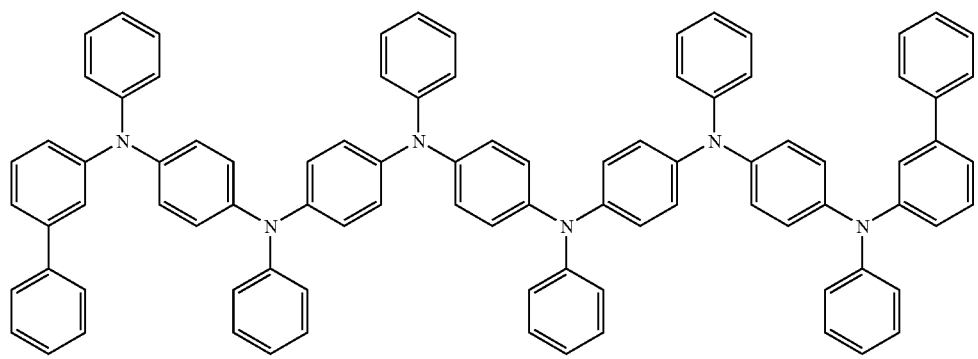
HM-47
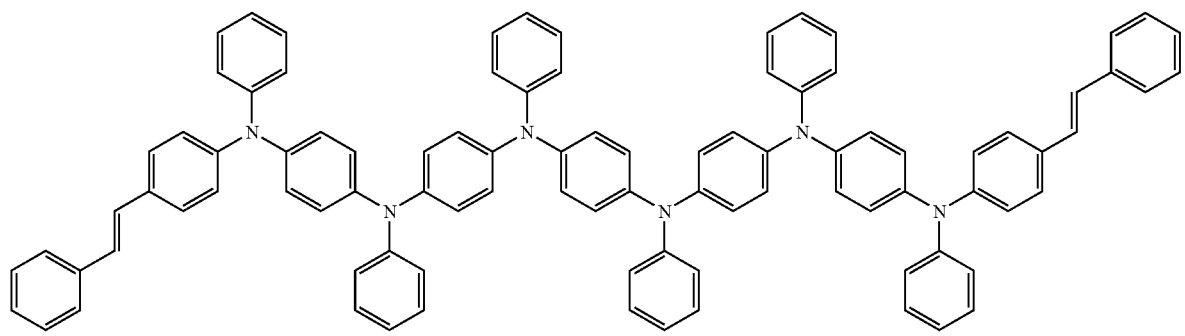
HM-48
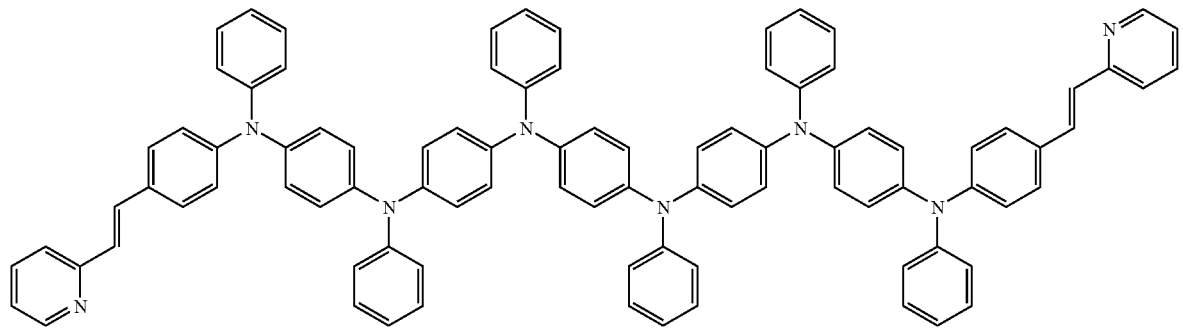

-continued
HM-49
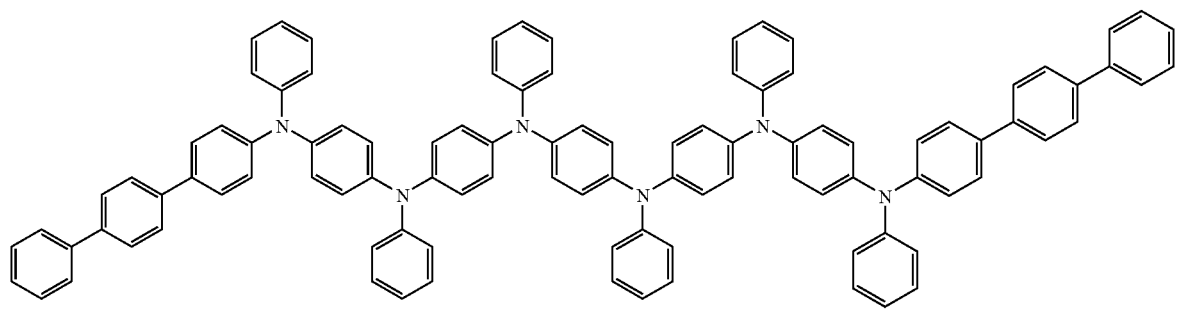
HM-50
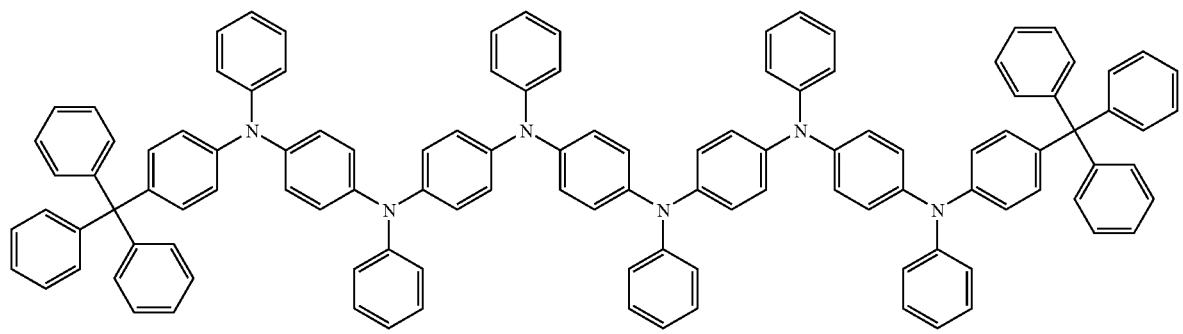
HM-51
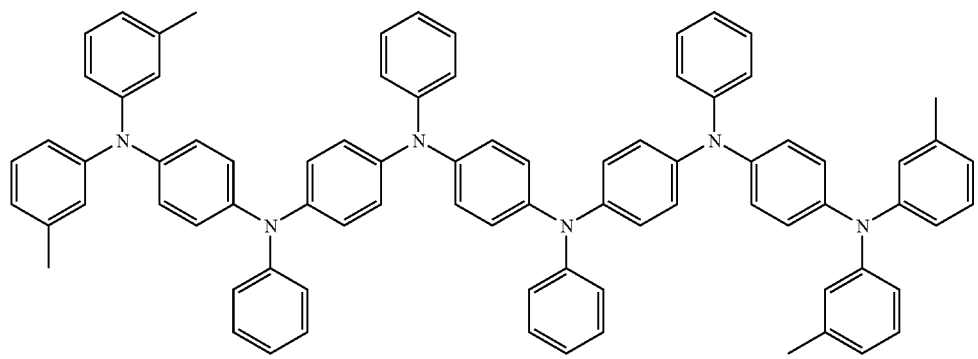
HM-52
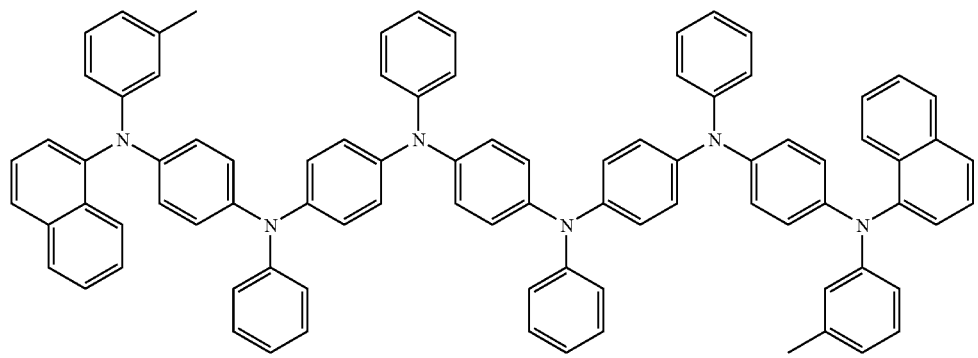

HM-53
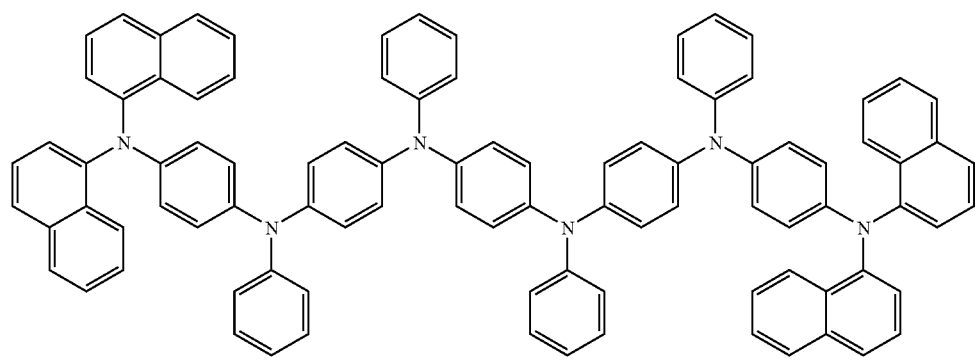
HM-54
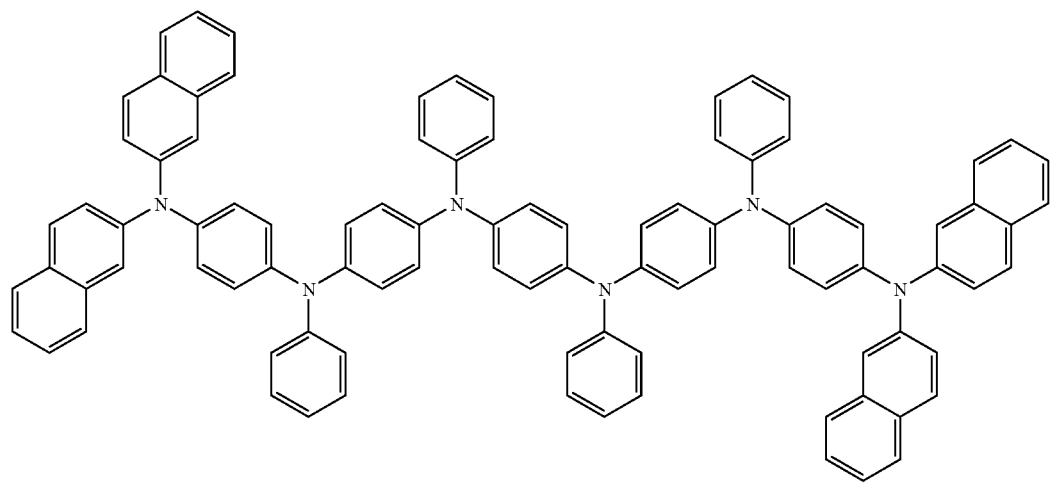
HM-55
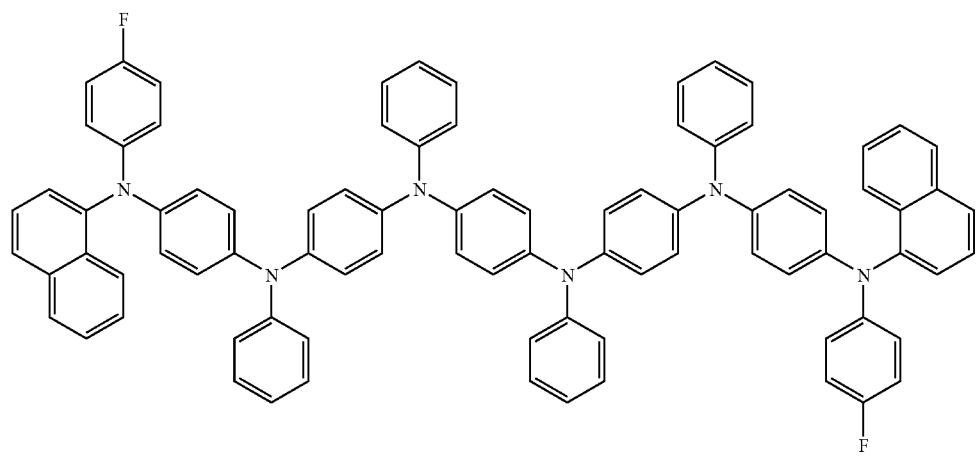

HM-56
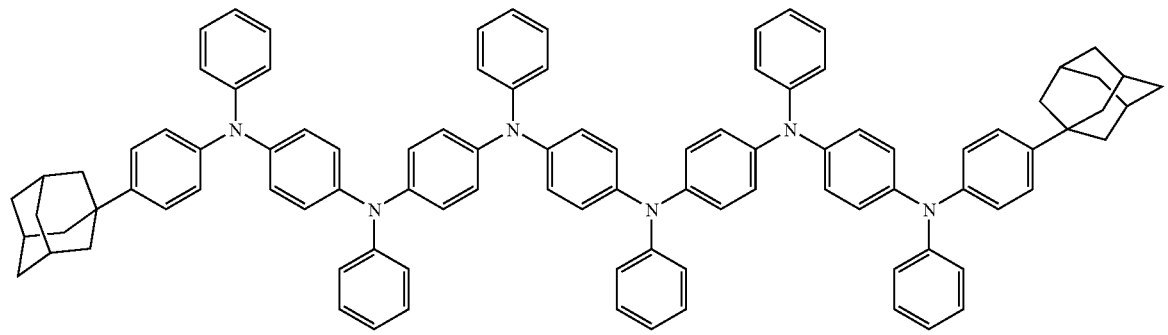
HM-57
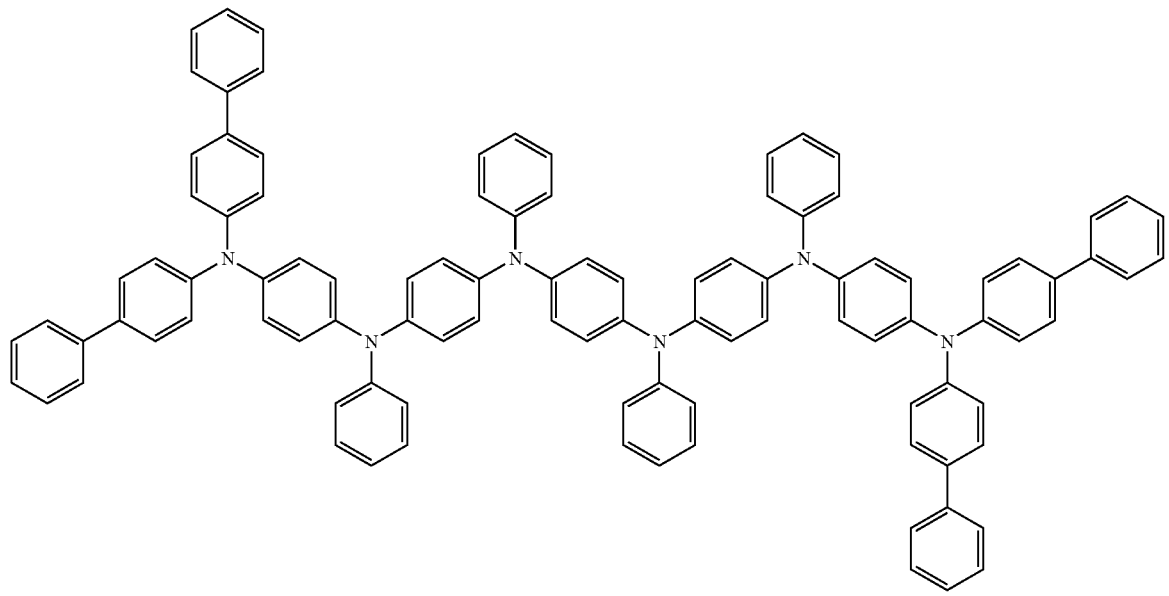
HM-58
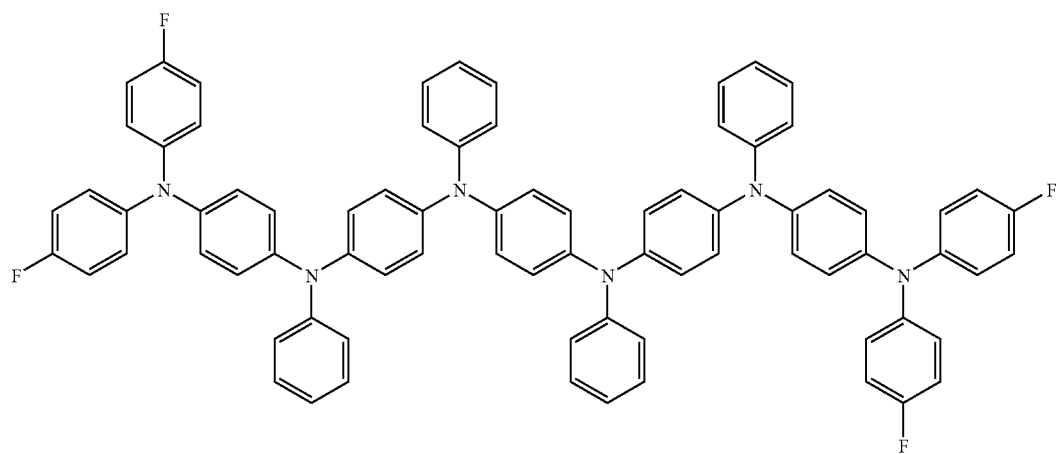

-continued
HM-59
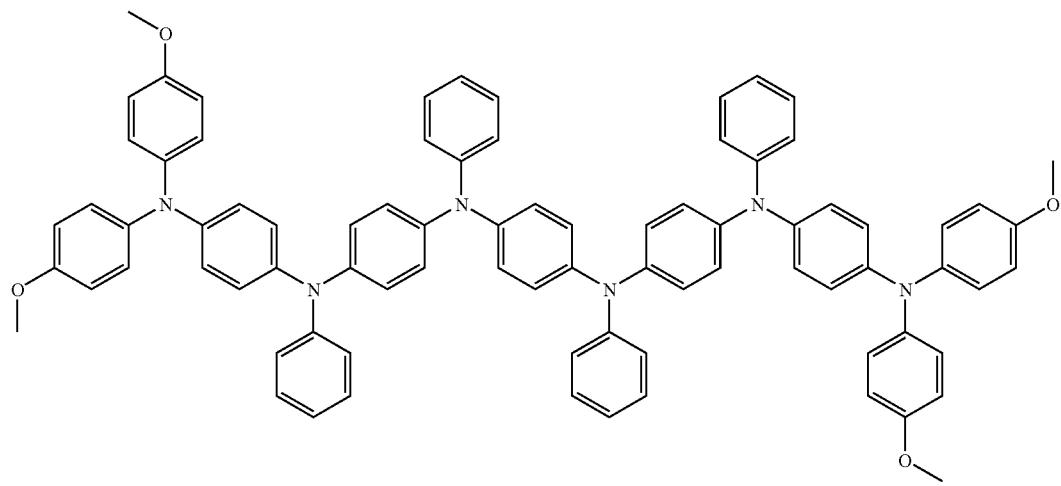
HM-60
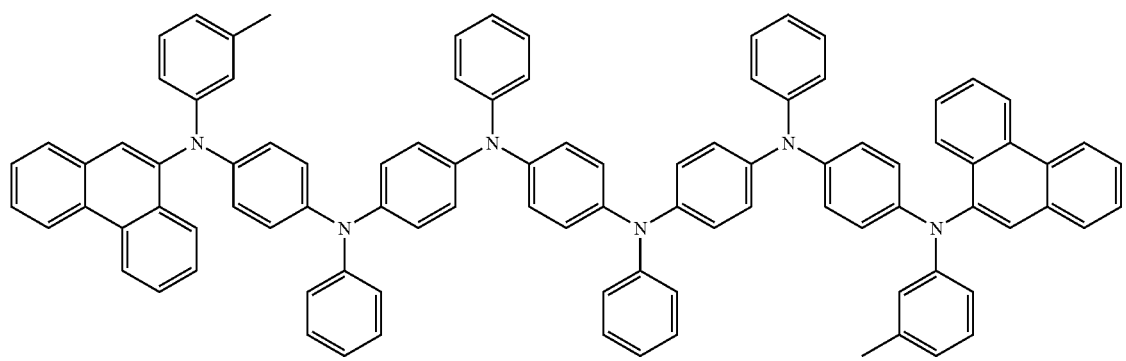
HM-61
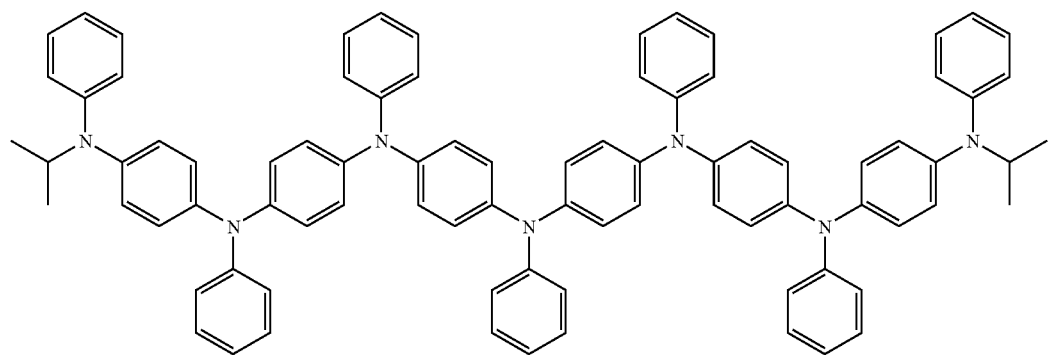
HM-62
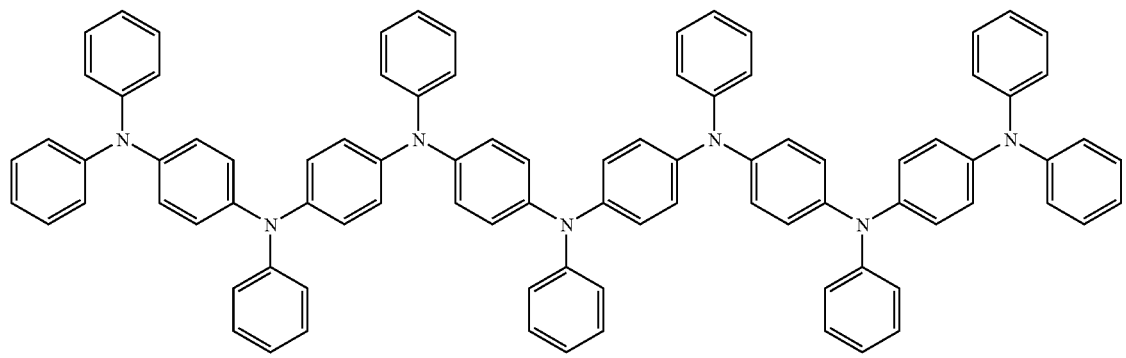

-continued
HM-63
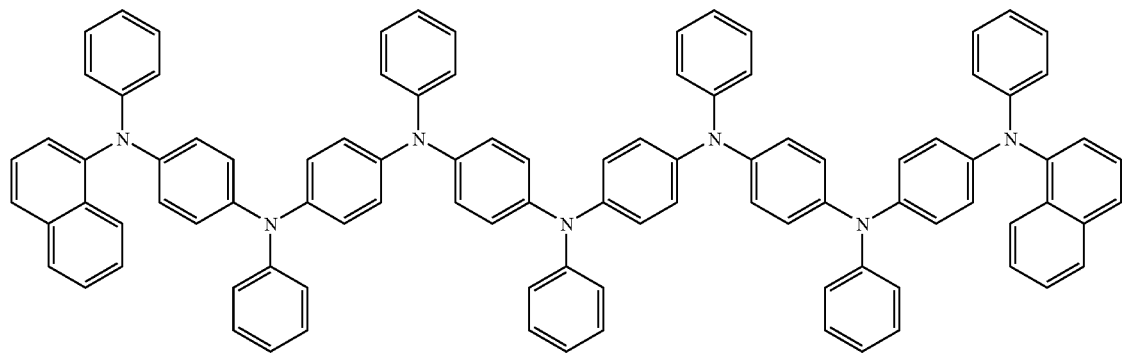
HM-64
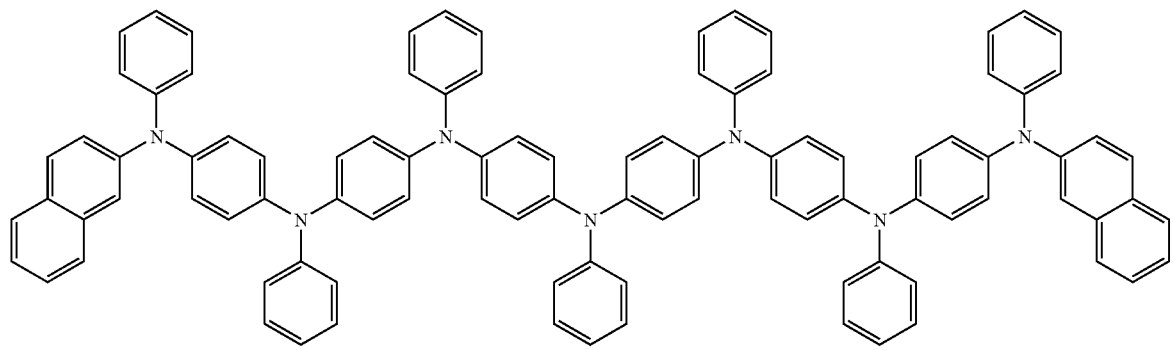
HM-65
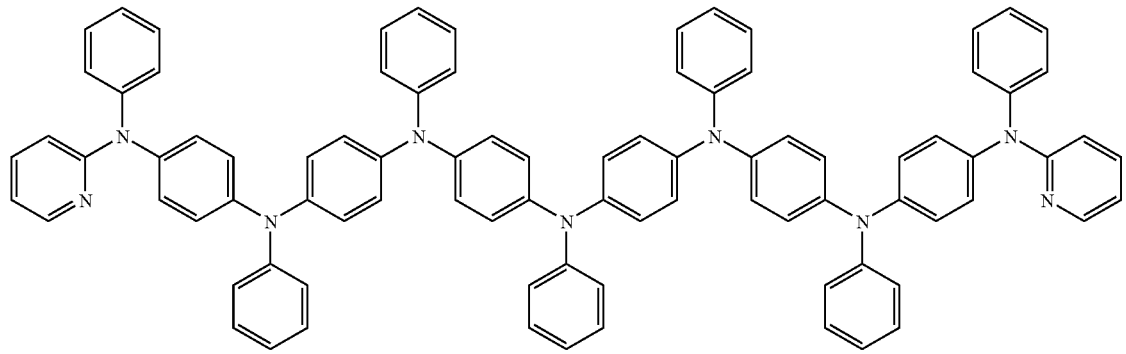
HM-66
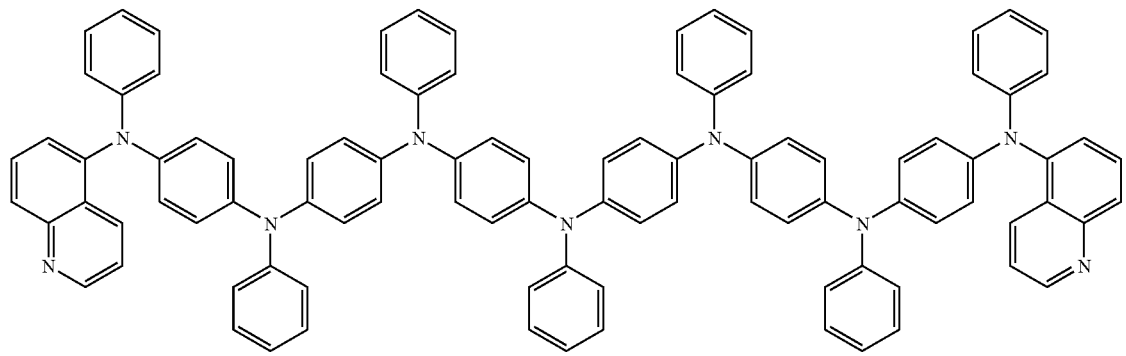

-continued
HM-67
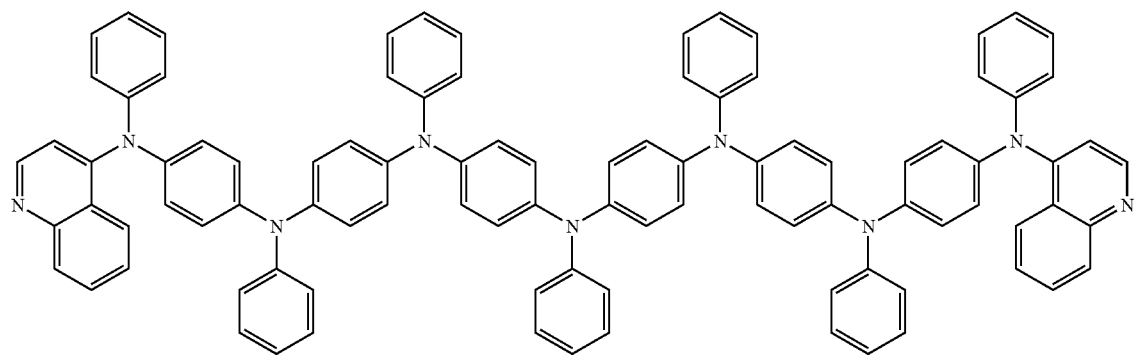
HM-68
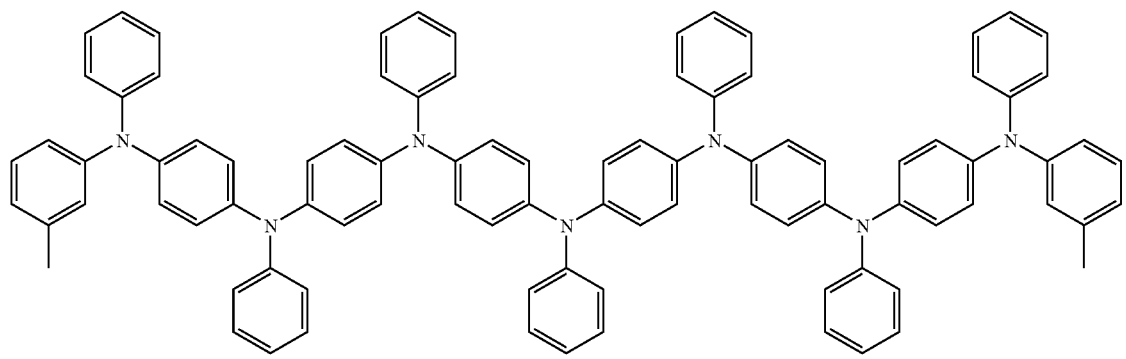
HM-69
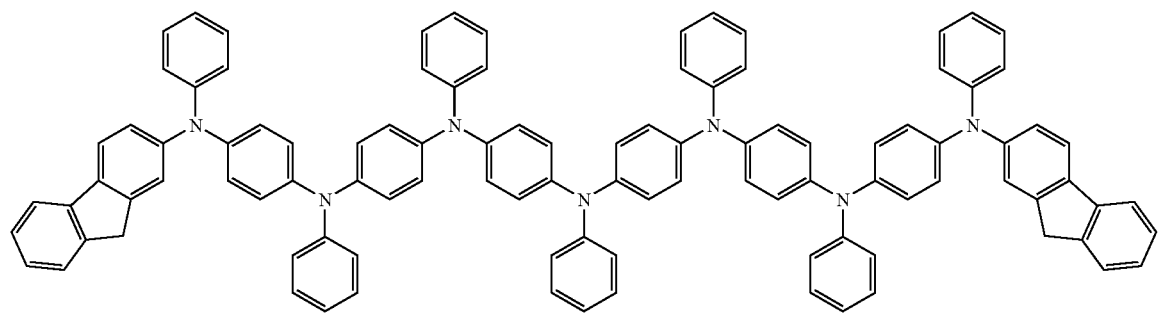
HM-70
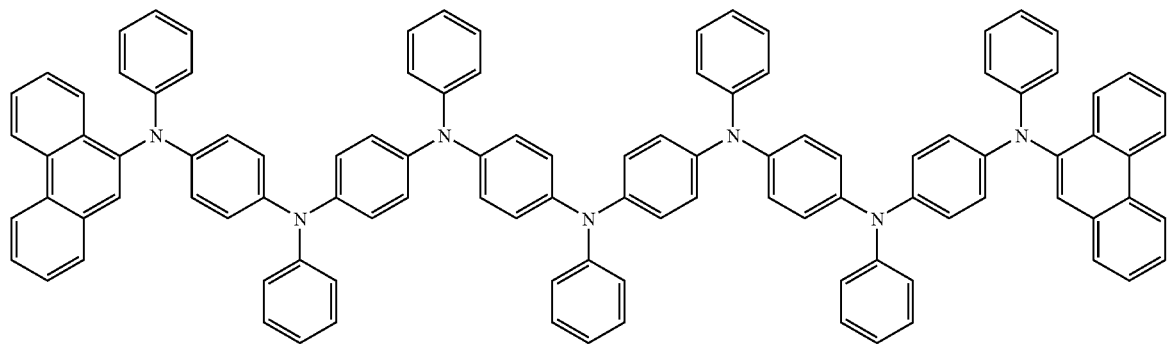

-continued
HM-71
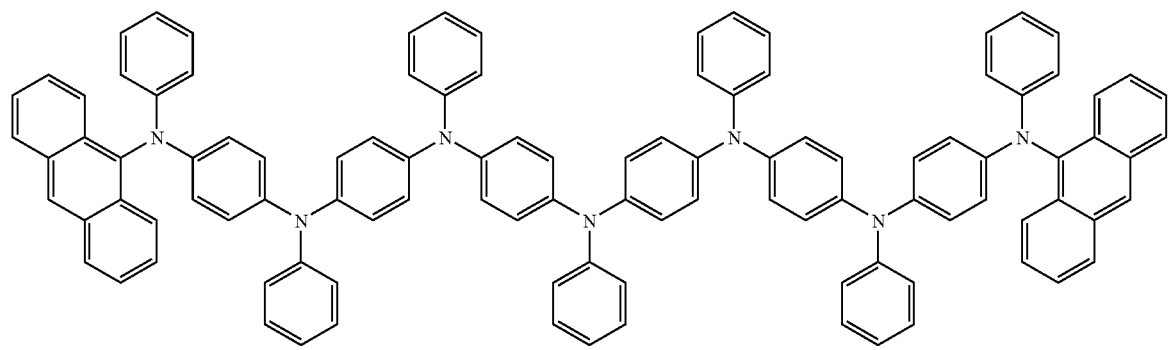
HM-72
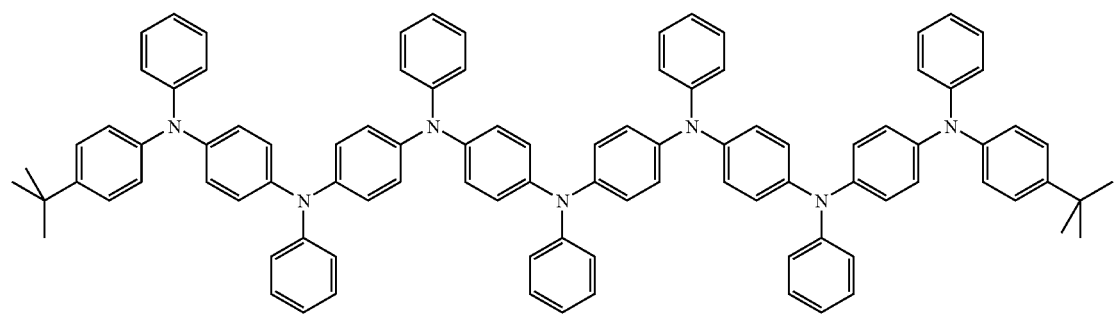
HM-73
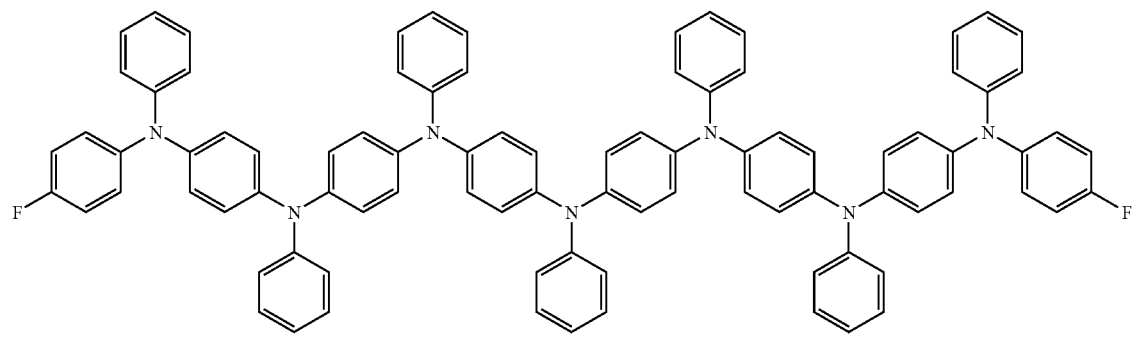
HM-74
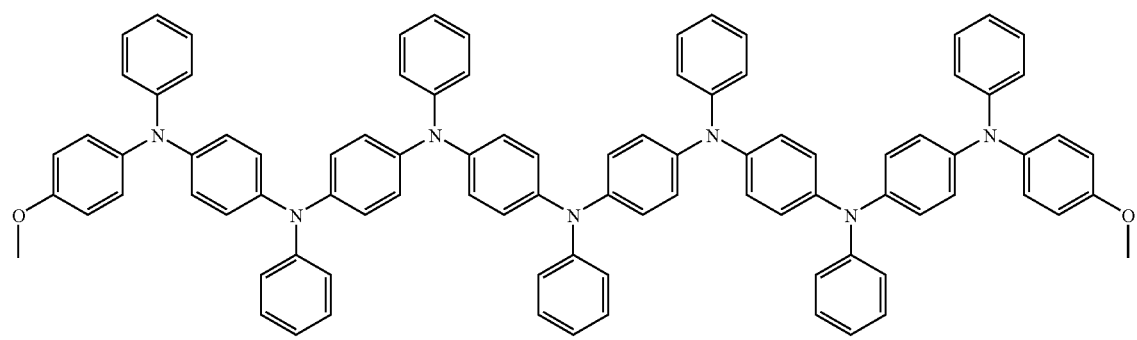

-continued
HM-75
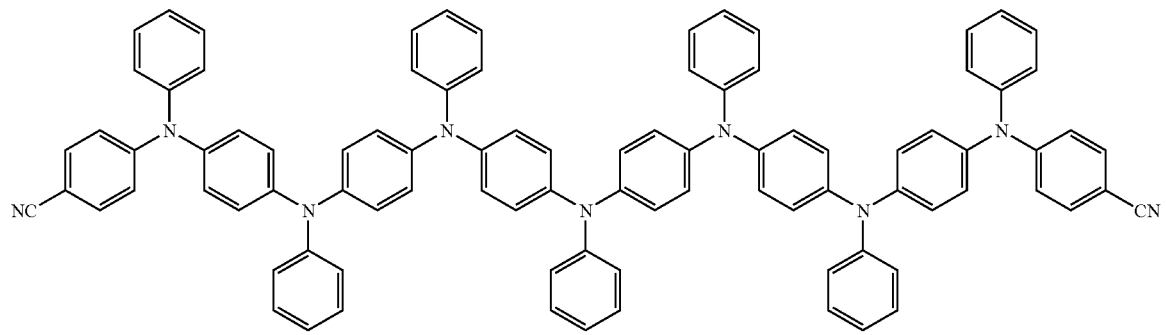
HM-76
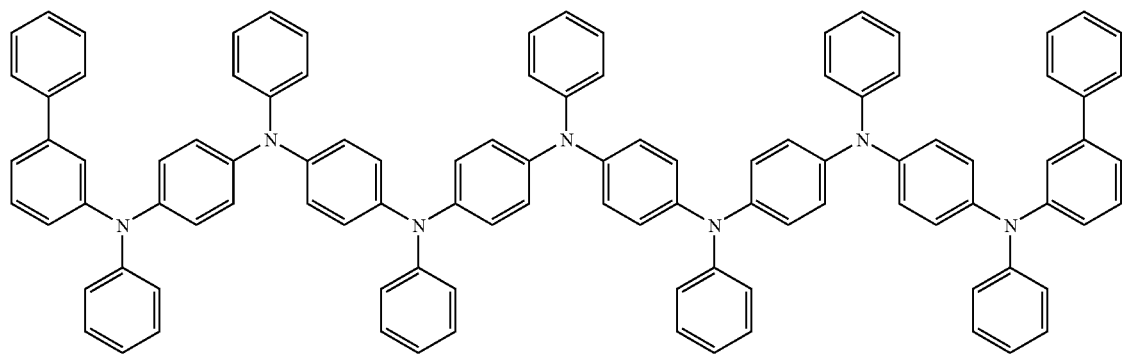
HM-77
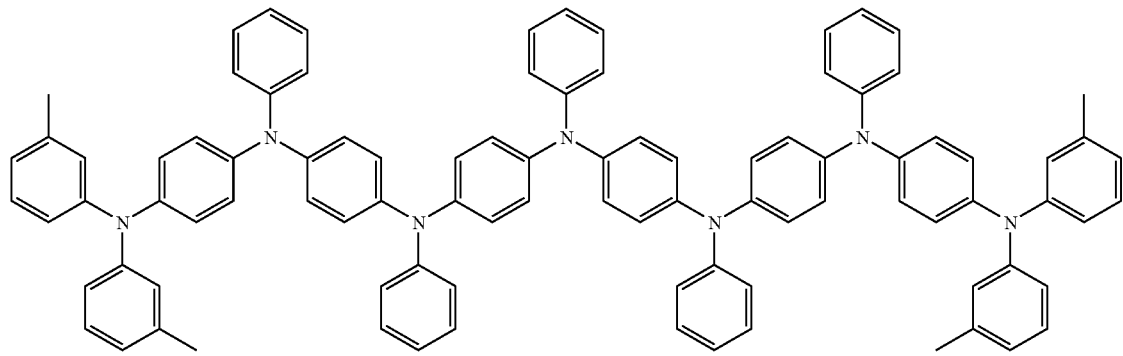
HM-78
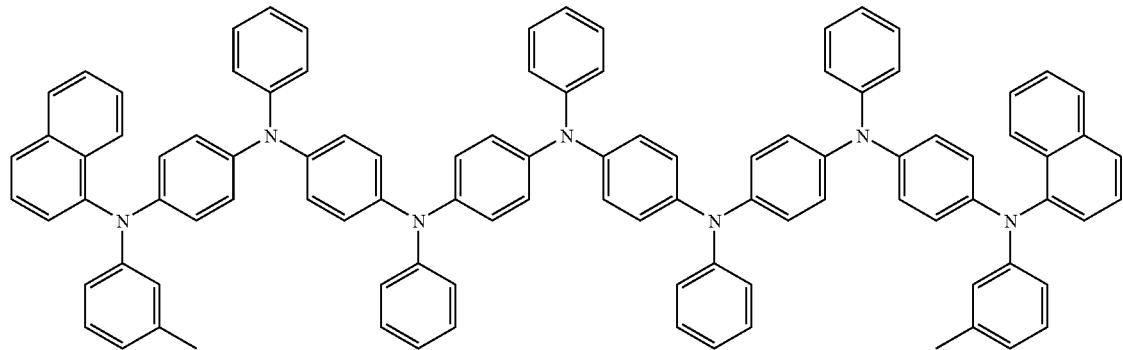

-continued
HM-79
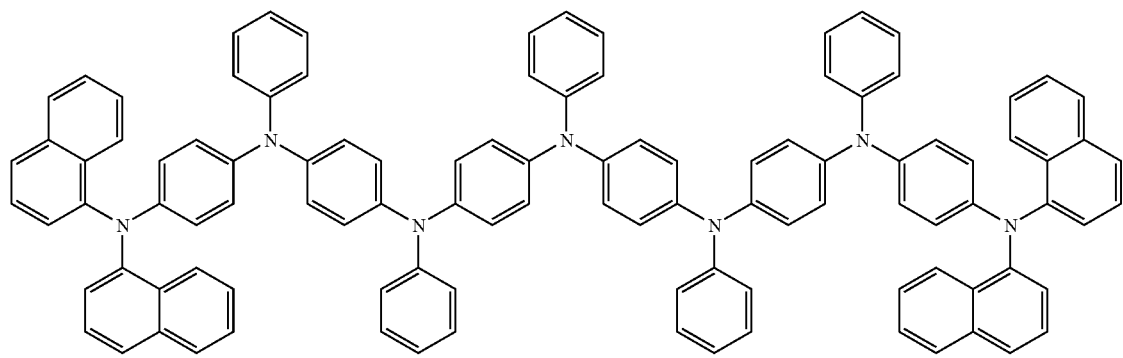
HM-80
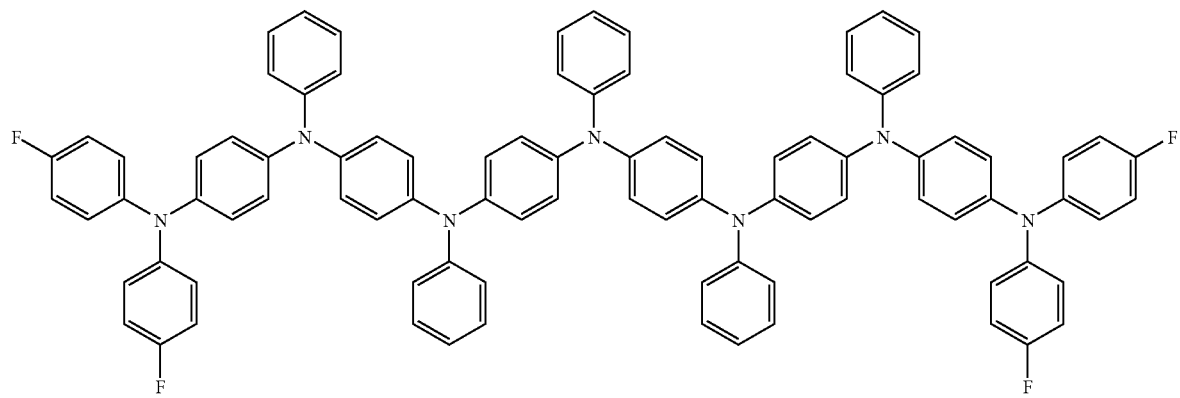
HM-81
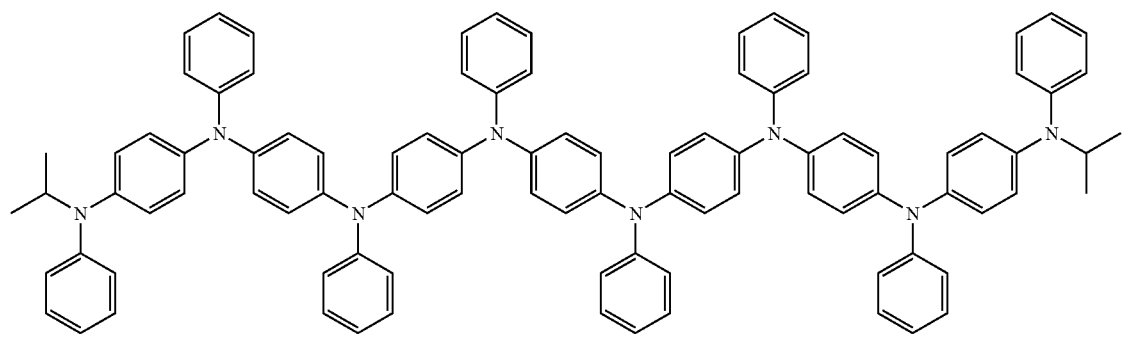
HM-82
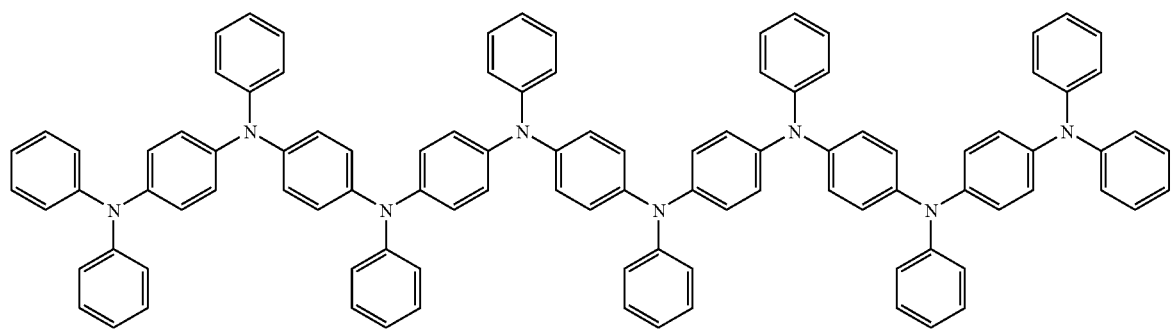

-continued
HM-83
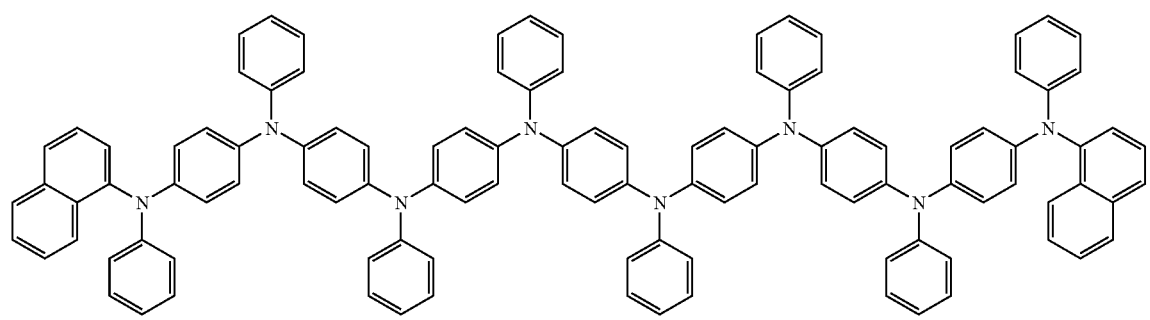
HM-84
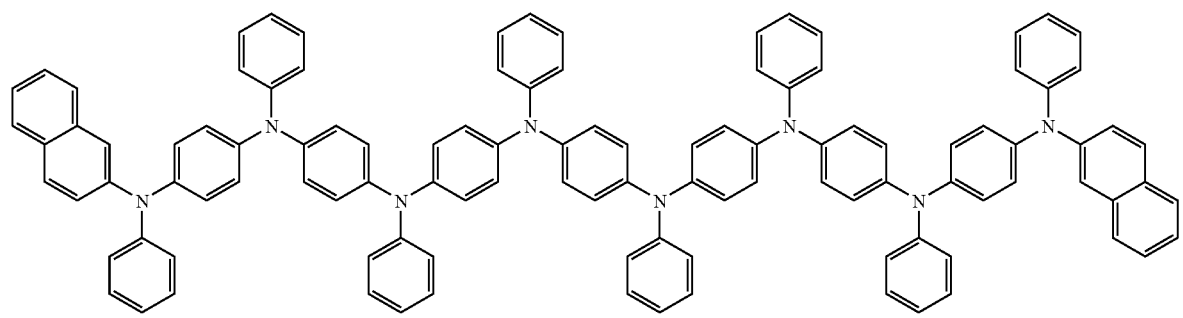
HM-85
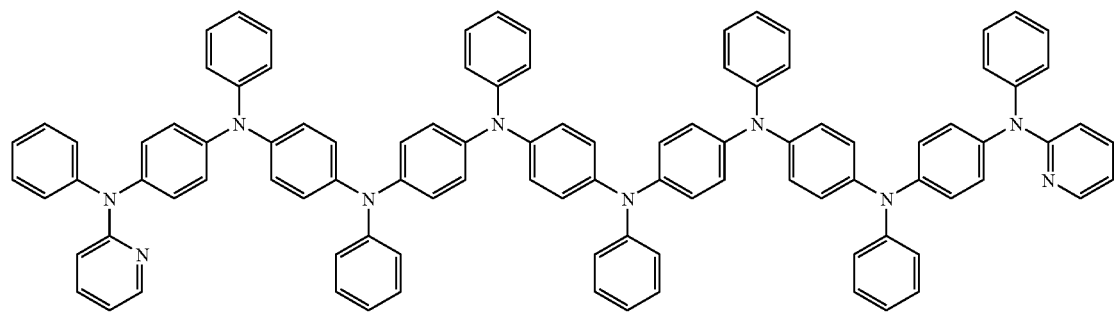
HM-86
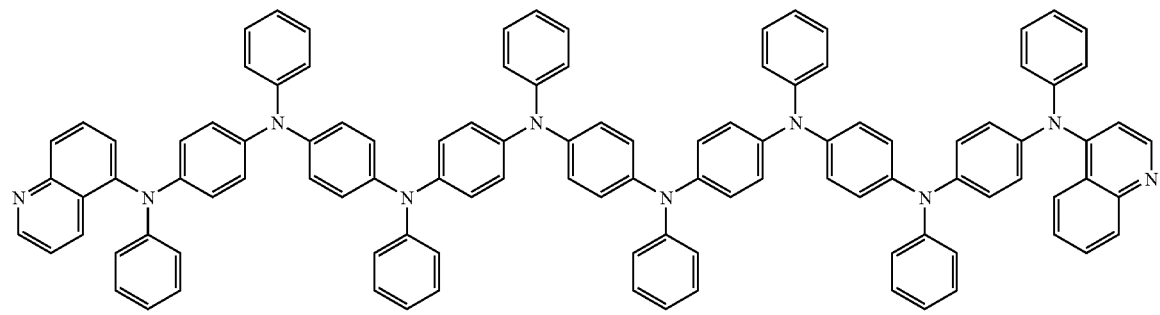

-continued
HM-87
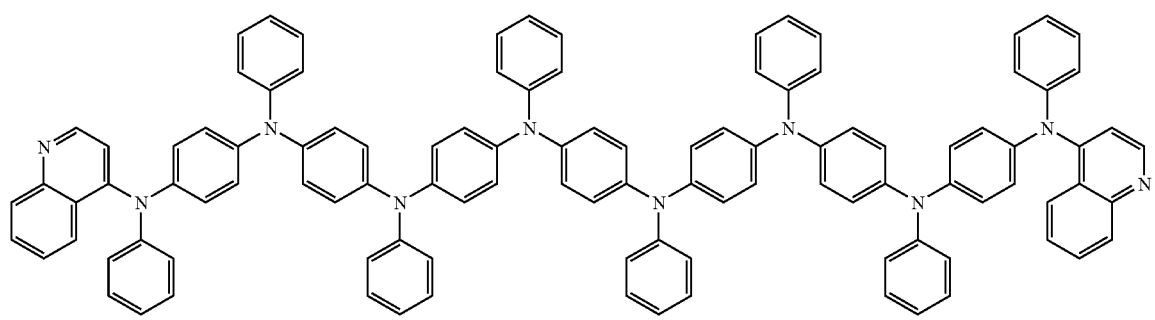
HM-88
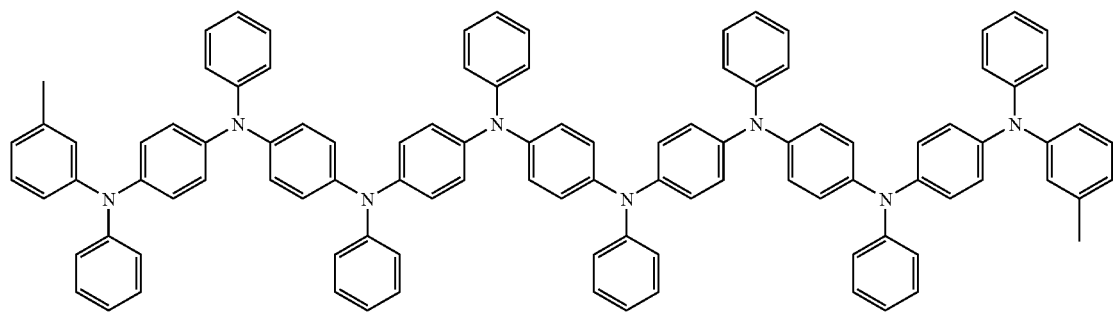
HM-89
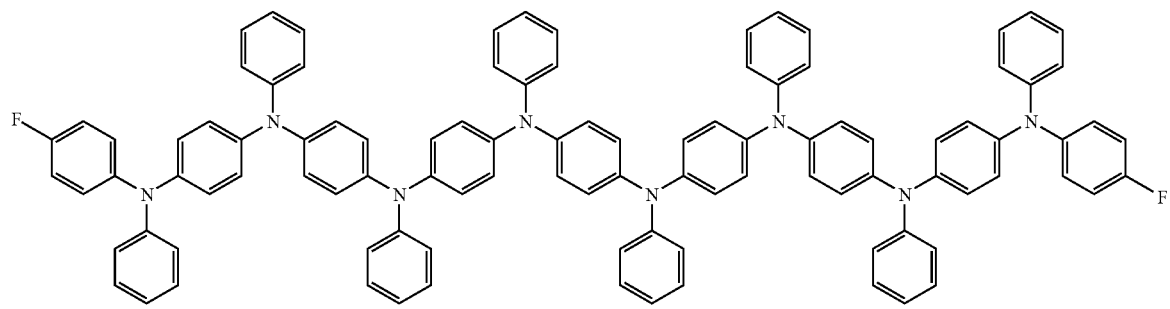
HM-90
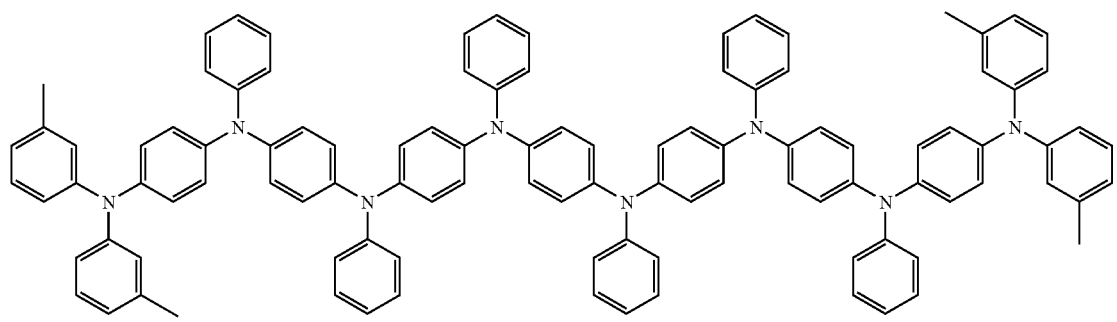

-continued
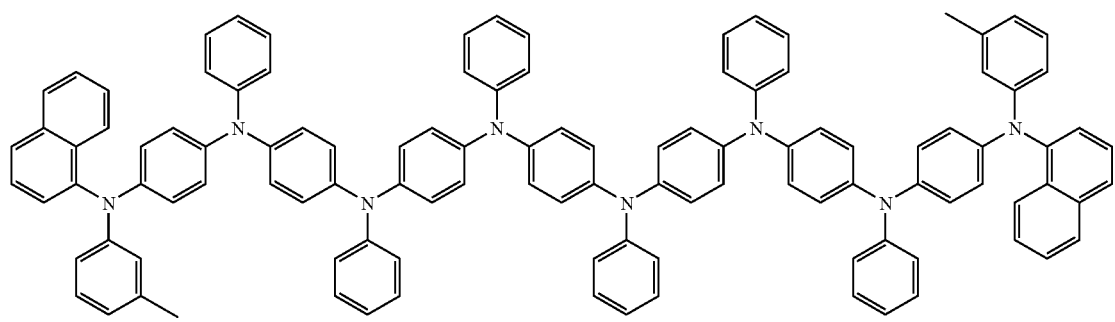
HM-91
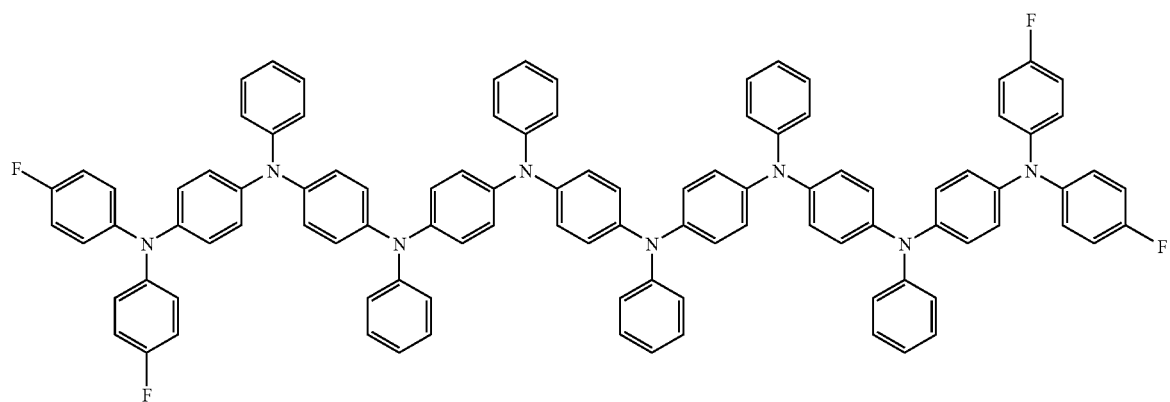
HM-92
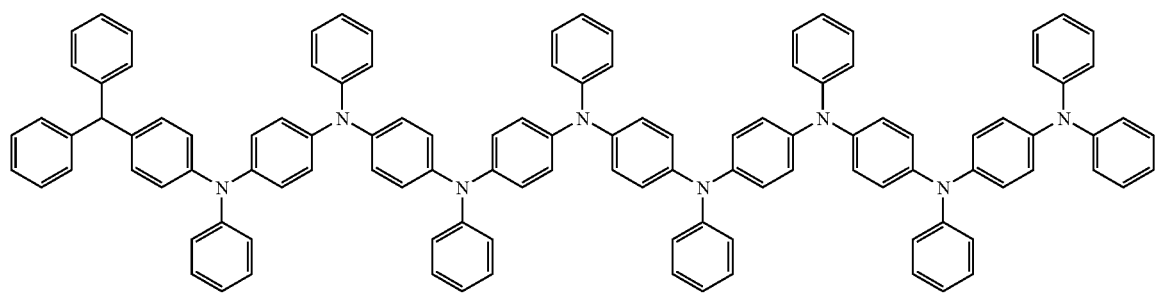
HM-93
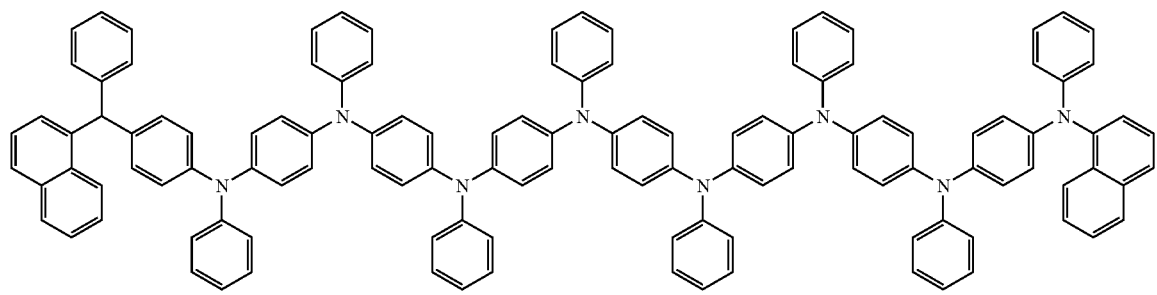
HM-94

-continued
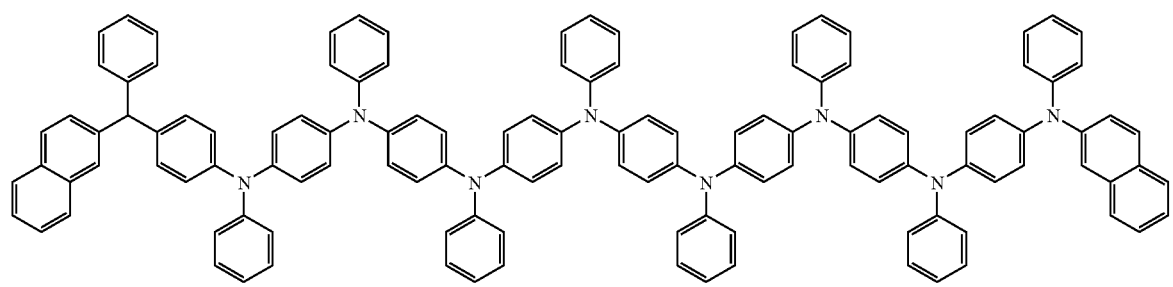
HM-95
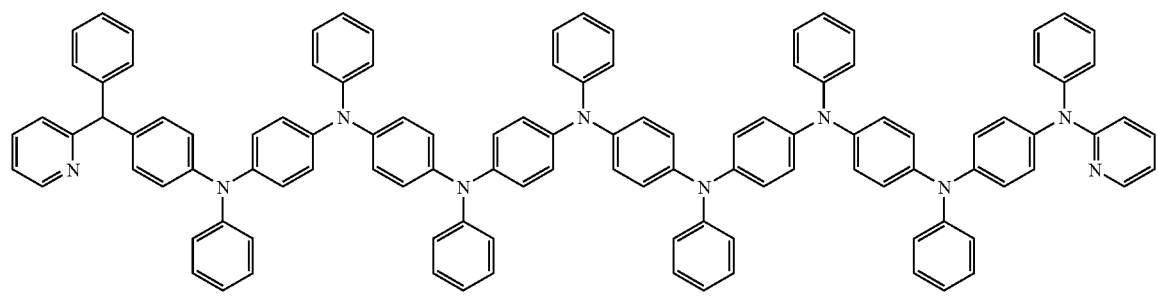
HM-96
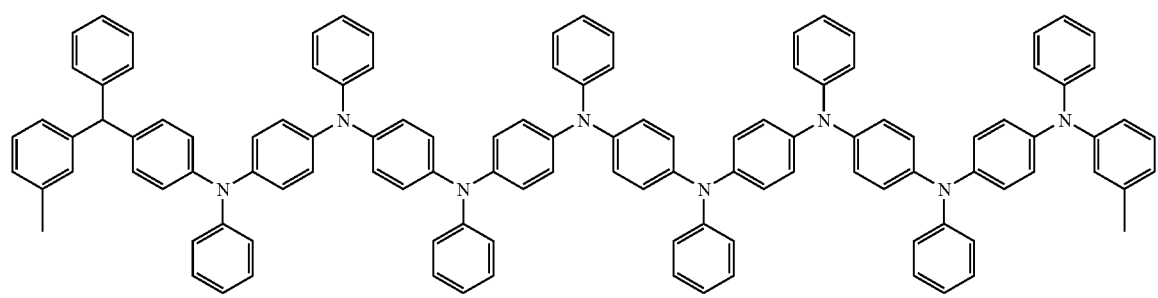
HM-97
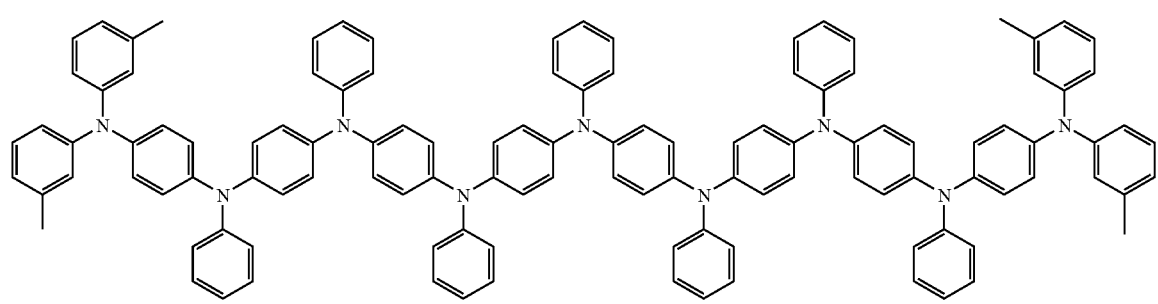
HM-98

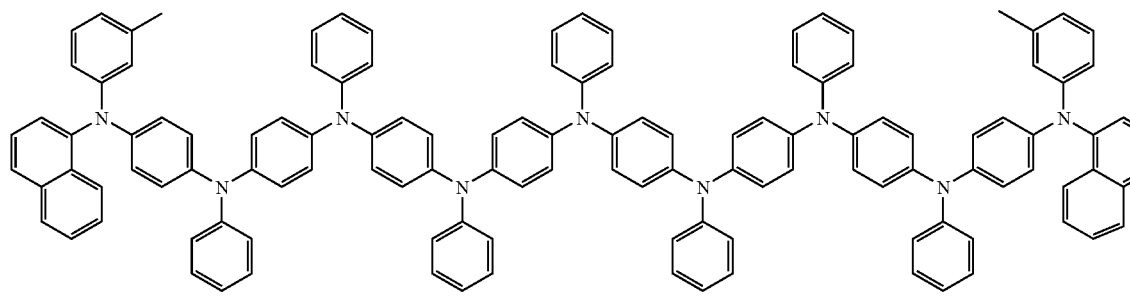

HM-99

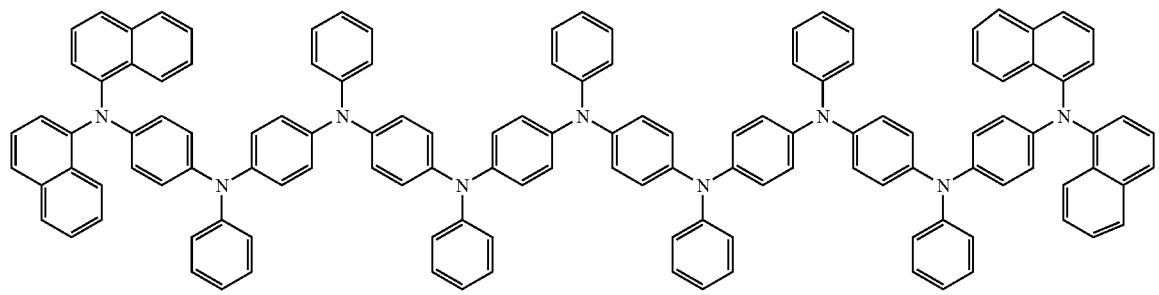

HM-100

At this time, one of the materials for the hole injecting layer and/or the hole transport layer, HM-32, will be synthesized as follows.

1. Synthesis of [(4-bromo-phenyl)-diphenyl-amine]

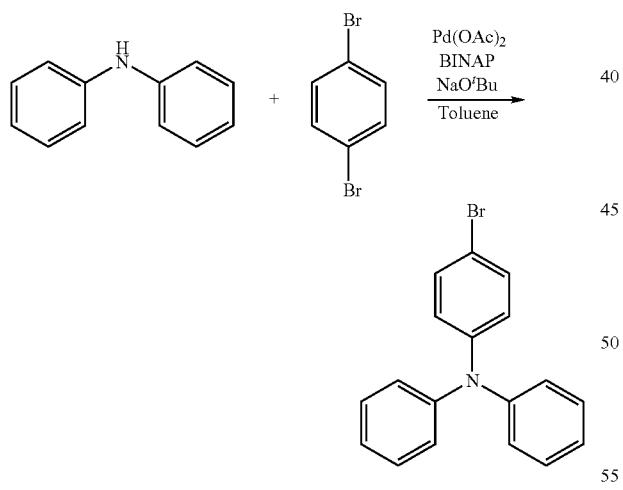

In a two-neck round bottom flask, diphenylamine (50 g, 0.30 mol), dibromobenzene (104 g, 0.44 mol), BINAP[2,2'-Bis(diphenylphosphino)-1,1'-binaphthyl] (7.4 g, 4% mol), Pd(OAc)$_2$[Palladium(II)acetate] (2.0 g, 3% mol), and NaO$^t$Bu[Sodium tert-butoxide] (42.6 g, 0.44 mol) are dissolved in toluene (400 mL), and then are maintained for 24 hours by reflux. On completion of the reaction, the flask having the resultant solution is cooled, and then toluene, a solvent of the reaction, is removed from the resultant solution. After that, the resultant solution having no toluene reacts on methylene-chloride and water, and then methylene-chloride is removed therefrom, and is performed by silica gel column chromatography with a solvent of methylene-chloride and hexane at a ratio of 3 to 1. After that, the solvent is removed from the resultant solution of completing silica gel column chromatography, and is recrystallized and filtered with methylene-chloride and petroleum ether, thereby obtaining a white solid, (4-bromo-phenyl)-diphenyl-amine (36.5 g, 40%).

2. Synthesis of (N,N,N'-triphenyl-benzene-1,4-diamine)

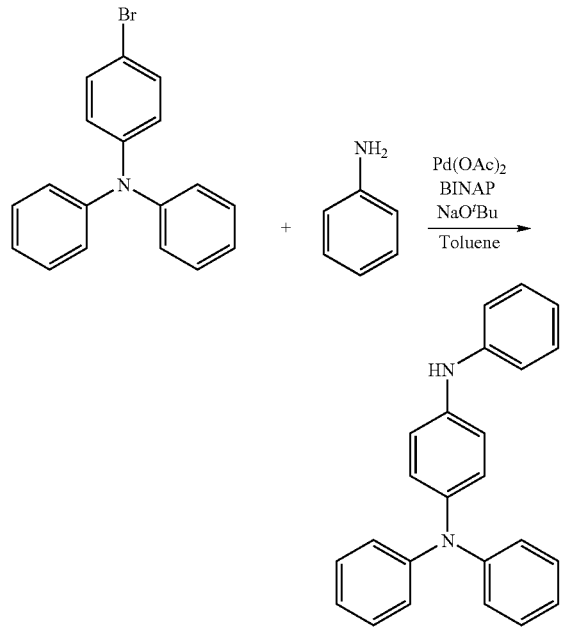

In a two-neck round bottom flask, (4-bromo-phenyl)-diphenyl-amine (12 g, 0.037 mol), aniline (16.26 ml, 0.178 mol), BINAP (0.4 g, 3% mol), Pd(OAc)$_2$ (7.4 g, 4% mol), and NaO$^t$Bu (17.2 g, 0.178 mol) are dissolved in toluene (300 mL), and then are maintained for 18 hours by reflux. On completion of the reaction, the flask having the resultant solution is cooled, and then toluene, a solvent of the reaction, is removed from the resultant solution. After that, the resultant solution having no toluene reacts on methylene-chloride and water, and then methylene-chloride is removed therefrom, and is performed by silica gel column chromatography with a solvent of methylene-chloride and hexane at a ratio of 2 to 1. After that, the solvent is removed from the resultant solution of completing silica gel column chromatography, and is recrystallized and filtered with methylene-chloride and petroleum ether, thereby obtaining a white solid, N,N,N'-triphenyl-benzene-1,4-diamine (11.0 g, 88%).

3. Synthesis of (N,N'-Bis(3-bromophenyl)-N,N'-diphenyl-1,4-phenylenediamine)

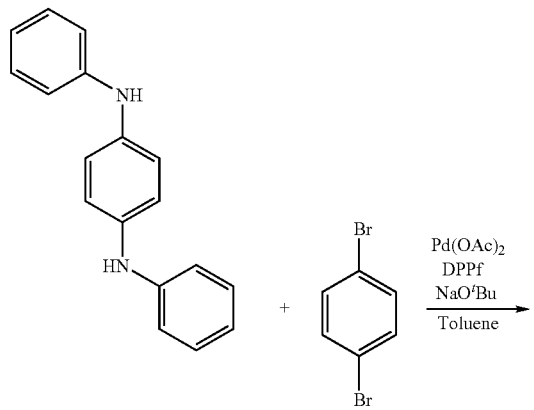

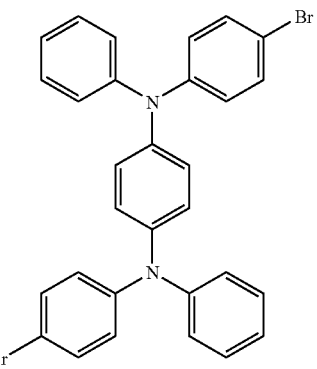

In a two-neck round bottom flask, N,N'-Diphenyl-1,4-phenylenediamine (5 g, 0.019 mol), Dibromobenzene (45 g, 0.19 mol), DPPf[1,1'-Bis(diphenylphosphino)ferrocene] (0.71 g, 6% mol), Pd(OAc)$_2$(2.0 g, 4% mol), and NaO$^t$Bu (7.0 g, 0.07 mol) are dissolved in toluene (150 mL), and then are heated at a temperature of 110° C. for 50 hours. On completion of the reaction, the flask having the resultant solution is cooled, and then toluene, a solvent of the reaction, is removed from the resultant solution. After that, the resultant solution having no toluene is dissolved in methylene-chloride, and then is performed by silica gel column chromatography (methylene-chloride). Then, the solvent is removed from the resultant solution performed by silica gel column chromatography, and is recrystallized and filtered by using methylene-chloride and methanol, thereby obtaining a gray solid, N,N'-bis(3-bromophenyl)-N,N'-diphenyl-1,4-phenylenediamine (6.5 g, 60%).

4. Synthesis of HM-32

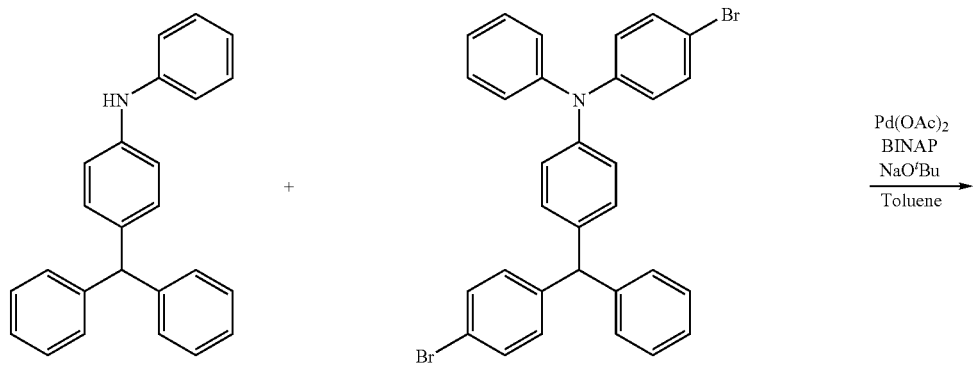

-continued

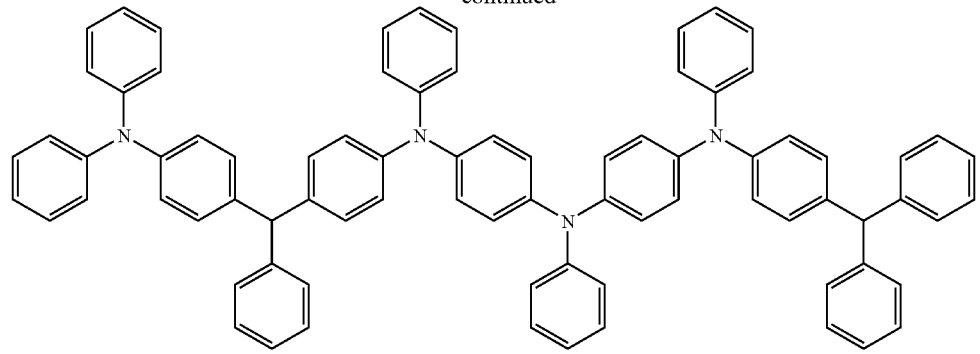

In a two-neck round bottom flask, N,N,N'-triphenyl-benzene-1,4-diamine (2.54 g, 0.0066 mol), N,N'-Bis(3-bromophenyl)-N,N'-diphenyl-1,4-phenylenediamine (1.5 g, 0.0026 mol), BINAP (0.7 g, 4% mol), Pd(OAc)$_2$(0.02 g, 3% mol), and NaO$^t$Bu (17.2 g, 0.0092 mol) are dissolved in toluene (100 mL), and then are maintained for 40 hours by reflux. On completion of the reaction, the flask having the resultant solution is cooled, and then toluene, a solvent of the reaction, is removed from the resultant solution. After that, the resultant solution having no toluene is filtered by methanol, and then is dissolved in chloro-benzene. Then, the solution dissolved in chloro-benzene is performed by silica gel column chromatography, thereby removing impurities and solvent from the solution. Next, the solution having no impurities and solvent is recrystallized and filter by using chloro-benzene and hexane, thereby obtaining a white solid, HM-32 (1.8 g, 64%).

Hereinafter, the preferred embodiments of the organic electroluminescence device, to which the material of the hole injecting layer or the hole transport layer is applied, according to the present invention will be described as follows.

FIRST EMBODIMENT (HM-32 IS USED FOR THE MATERIAL OF THE HOLE INJECTION LAYER)

First, after an ITO glass substrate is patterned to have a luminescence area of 3 mm×3 mm, the ITO glass substrate is cleaned. Then, the ITO glass substrate is mounted in a vacuum chamber, and a base pressure is set at $1.0\times10^{-6}$ torr. On the ITO glass substrate, an organic material is formed in order of HM-32(600 Å)/NPB(400 Å)/Alq$_3$(C6)(200 Å, 3%)/Alq3(400 Å)/LiF(5 Å)/Al(1000 Å). In case the hole injecting layer is formed of HM-32, it shows the luminance/driving voltage of 1720 cd/m$^2$(9.19V) at 1 mA, wherein CIEx=0.335 and y=0.621.

SECOND EMBODIMENT (HM-02 IS USED FOR THE MATERIAL OF THE HOLE TRANSPORT LAYER)

First, after an ITO glass substrate is patterned to have a luminescence area of 3 mm×3 mm, the ITO glass substrate is cleaned. Then, the ITO glass substrate is mounted in a vacuum chamber, and a base pressure is set at $1.0\times10^{-6}$ torr. On the ITO glass substrate, an organic material is formed in order of CuPC(200 Å)/HM-02(400 Å)/Alq$_3$(C6)(200 Å, 3%)/Alq3(400 Å)/LiF(5 Å)/Al(1000 Å). In case the hole transport layer is formed of HM-02, it shows the luminance/driving voltage of 1720 cd/m$^2$(9.05V) at 1 mA, wherein CIEx=0.335 and y=0.621.

For comparison with the present invention, the related art embodiments of the organic electroluminescence device, in which the hole injecting layer is formed of CuPC, will be described as follows.

After patterning an ITO glass substrate to have a luminescence area of 3 mm×3 mm, the ITO glass substrate is cleaned. Then, the ITO glass substrate is mounted in a vacuum chamber, and a base pressure is set at $1.0\times10^{-6}$ torr. On the ITO glass substrate, an organic material is formed in order of CuPC(200 Å)/NPB(400 Å)/Alq3(C6)(300 Å, 3%)/Alq$_3$(400 Å)/LiF(5 Å)/Al(1000 Å). In case the hole injecting layer is formed of CuPC, it shows the luminance/driving voltage of 1680 cd/m$^2$(9.20V) at 1 mA, wherein CIEx=0.339 and y=0.619. At this time, CuPC, NPB, Alq$_3$, and C6 can be expressed by the following chemical formula 3:

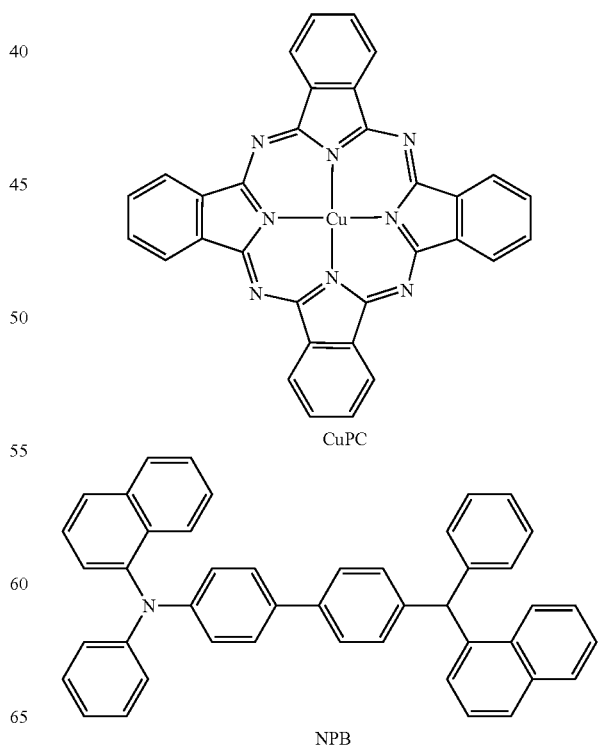

CuPC

NPB

-continued

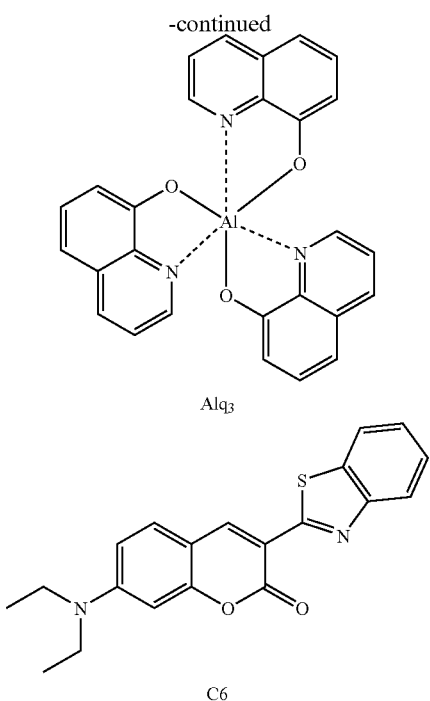

Alq₃

C6

As described above, in case of the related art, it shows the luminance/driving voltage of 1680 cd/m²(9.20V). Meanwhile, in case of forming the hole injecting layer with HM-32 according to the present invention, it shows the luminance/driving voltage of 170 cd/m² (9.19V). If the hole transport layer is formed of HM-02, it shows the luminance/driving voltage of 1720 cd/m² (9.05V). That is, the organic electroluminescence device according to the present invention realizes the improvement of luminance, and decrease of the driving voltage.

In the preferred embodiment of the present invention, the hole injecting layer or the hole transport layer is formed of some materials having the structure of the chemical formula 1. However, even though the hole injecting layer or the hole transport layer is formed of the material having the chemical formula 3, it is possible to improve the luminance and to decrease the driving voltage. Also, both the hole injecting layer and the hole transport layer may be formed of the material having the chemical formula 1, for the improvement of luminance and the decrease on driving voltage.

As mentioned above, the organic electroluminescence device according to the present invention has the following advantages.

In the organic electroluminescence device according to the present invention, the hole injecting layer and the hole transport layer are formed of the material having the aforementioned chemical formula 1, so that it is possible to improve the luminance and to decrease the driving voltage, thereby increasing the life span of the device by improving the operation characteristics.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electroluminescence device comprising:
  an anode, a hole injecting layer, a hole transport layer, an emitting layer, and a cathode,
  wherein the hole injecting layer and the hole transport layer are formed of any one material having the following chemical formula:

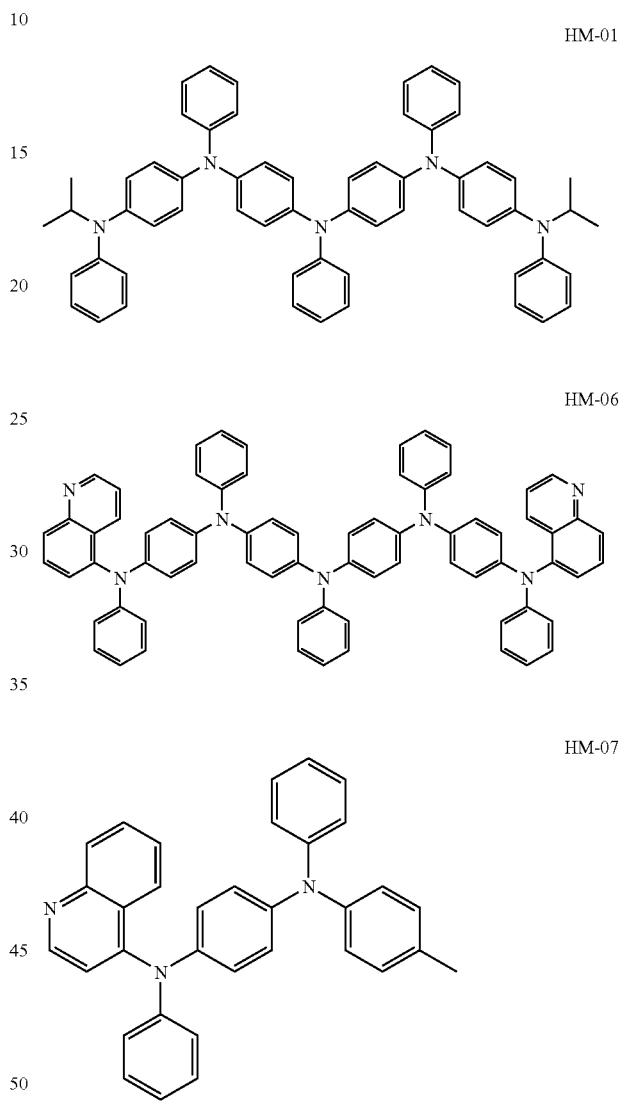

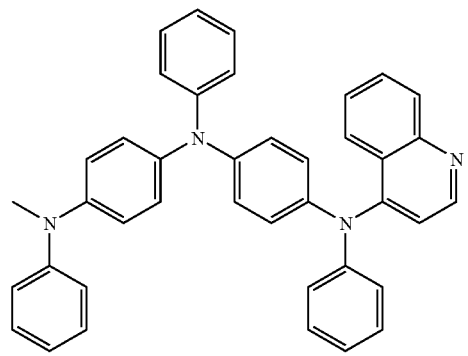

-continued
HM-31
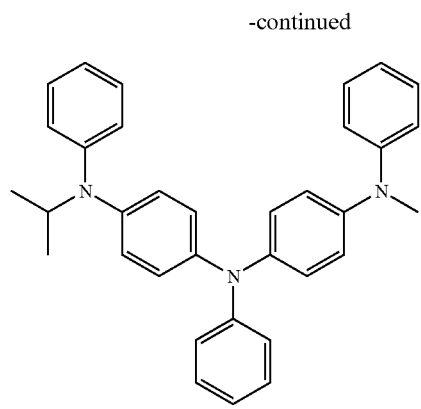
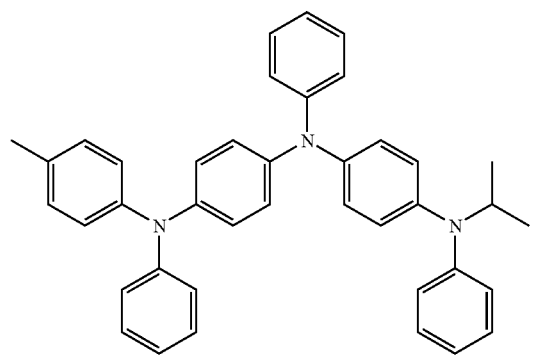
HM-36
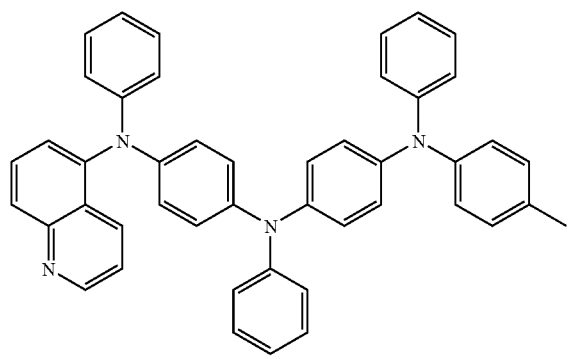
-continued
HM-37
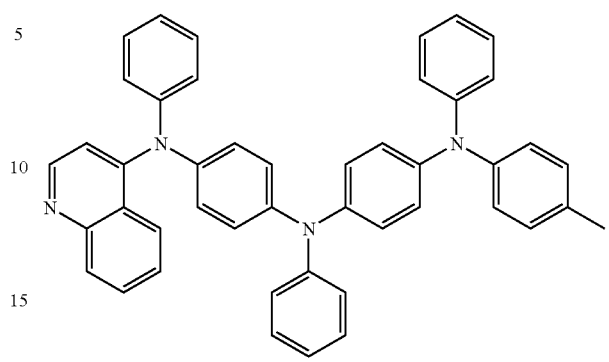
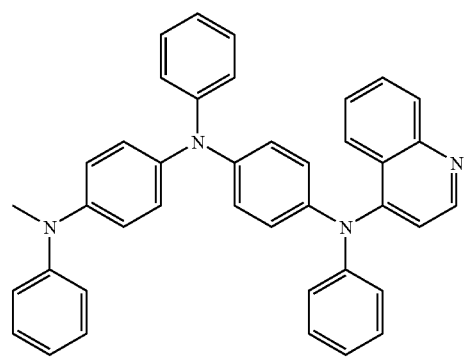
HM-61
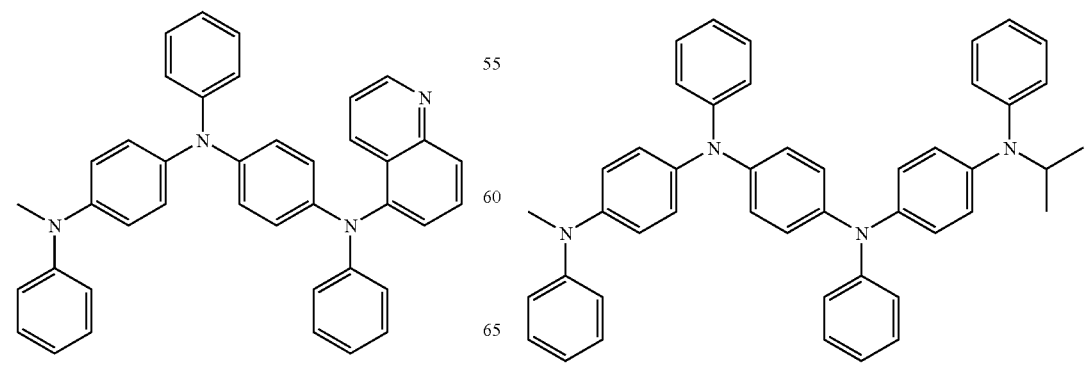

-continued
HM-66
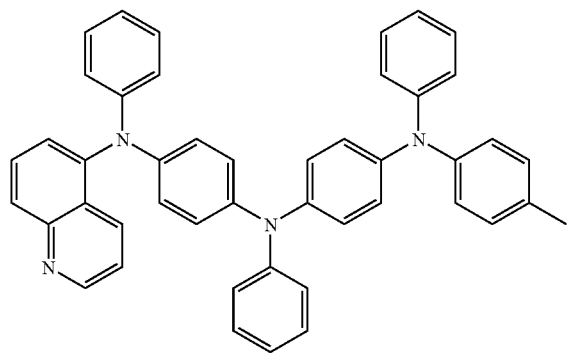
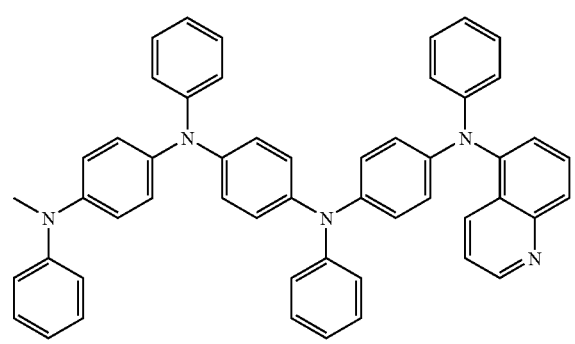
HM-67
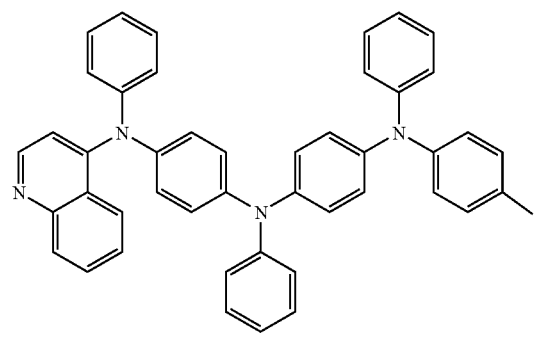
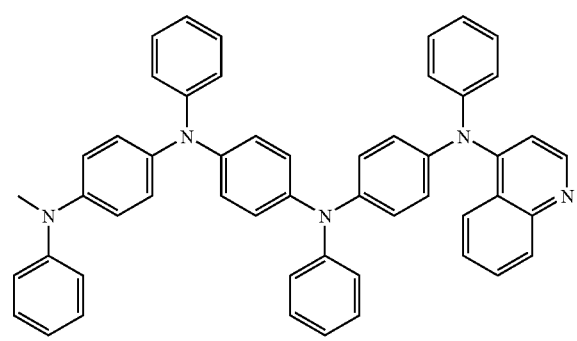
-continued
HM-81
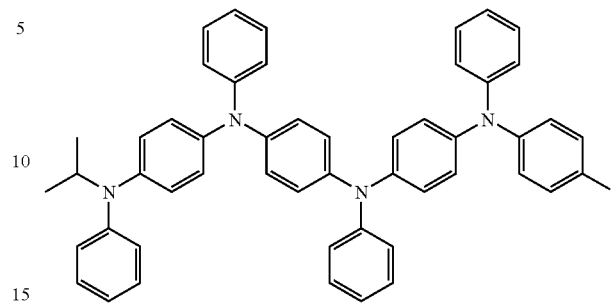
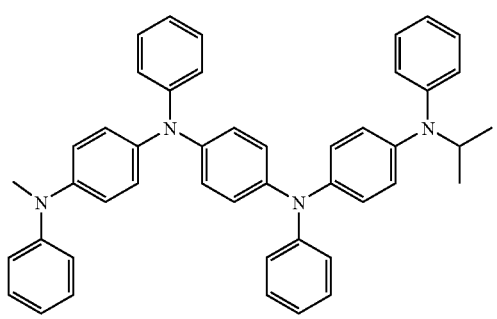
HM-86
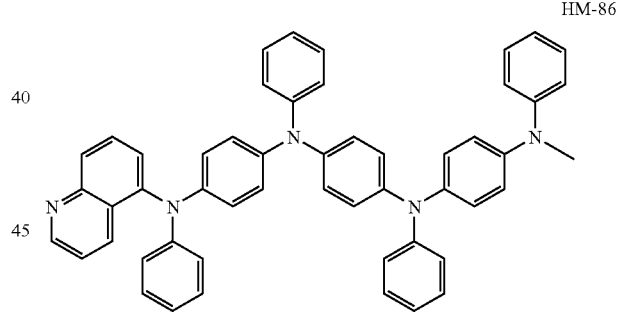
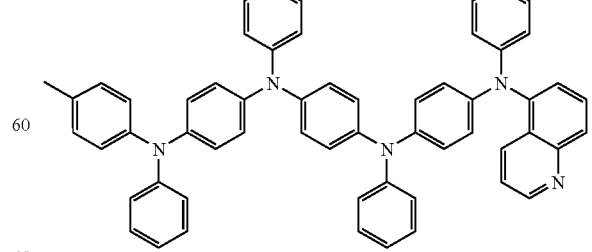

-continued
HM-87
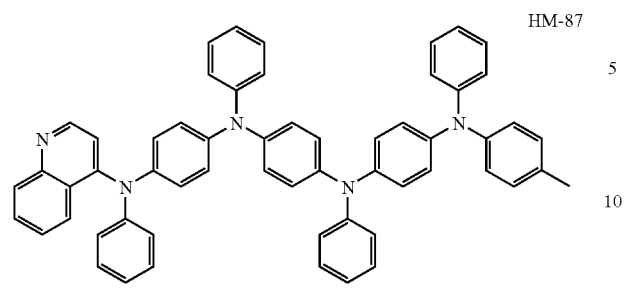
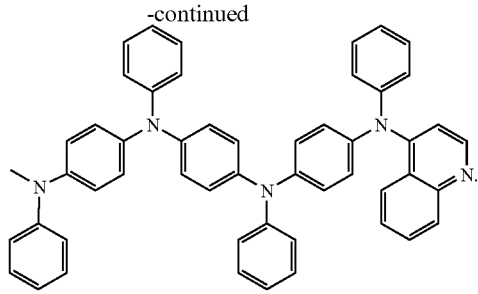
* * * * *